(12) United States Patent
Carlson et al.

(10) Patent No.: US 8,636,565 B2
(45) Date of Patent: Jan. 28, 2014

(54) DATA CENTER AIR CIRCULATION

(75) Inventors: Andrew Carlson, Atherton, CA (US); William Hamburgen, Palo Alto, CA (US); Jimmy Clidaras, Los Altos, CA (US)

(73) Assignee: Exaflop LLC, Mountain View, CA (US)

( * ) Notice: Subject to any disclaimer, the term of this patent is extended or adjusted under 35 U.S.C. 154(b) by 1117 days.

(21) Appl. No.: 11/757,348

(22) Filed: Jun. 1, 2007

(65) Prior Publication Data

US 2008/0055850 A1    Mar. 6, 2008

Related U.S. Application Data

(60) Provisional application No. 60/810,452, filed on Jun. 1, 2006.

(51) Int. Cl.
   *H05K 7/20*    (2006.01)

(52) U.S. Cl.
   USPC .......................................... 454/184; 361/691

(58) Field of Classification Search
   USPC .......................................... 454/184; 361/688
   See application file for complete search history.

(56) References Cited

U.S. PATENT DOCUMENTS

| | | | |
|---|---|---|---|
| 6,289,684 B1 | 9/2001 | Guidry, II et al. | |
| 6,374,627 B1 | 4/2002 | Schumacher et al. | |
| 6,473,668 B2 * | 10/2002 | Abuzeid et al. | 700/121 |
| 6,496,366 B1 | 12/2002 | Coglitore et al. | |
| 6,504,717 B1 * | 1/2003 | Heard | 361/695 |
| 6,506,111 B2 | 1/2003 | Sharp et al. | |
| D473,225 S | 4/2003 | Coglitore et al. | |
| 6,563,706 B1 | 5/2003 | Strickler | |
| D475,705 S | 6/2003 | Coglitore et al. | |
| 6,652,373 B2 | 11/2003 | Sharp et al. | |
| 6,652,374 B2 | 11/2003 | Sharp et al. | |
| 6,661,655 B2 * | 12/2003 | Yin | 361/679.48 |
| 6,667,891 B2 | 12/2003 | Coglitore et al. | |
| 6,668,565 B1 | 12/2003 | Johnson et al. | |
| 6,741,467 B2 | 5/2004 | Coglitore et al. | |
| 6,747,872 B1 | 6/2004 | Patel et al. | |
| 6,822,859 B2 | 11/2004 | Coglitore et al. | |
| 6,850,408 B1 | 2/2005 | Coglitore et al. | |
| 6,859,366 B2 | 2/2005 | Fink | |
| 6,880,349 B2 | 4/2005 | Johnson et al. | |
| 6,896,612 B1 * | 5/2005 | Novotny | 454/184 |
| 6,904,968 B2 | 6/2005 | Beitelmal et al. | |
| 6,967,283 B2 | 11/2005 | Rasmussen et al. | |
| 6,980,433 B2 | 12/2005 | Fink | |

(Continued)

OTHER PUBLICATIONS

Supplementary European Search Report & Written Opinion for Application No. EP 0678558.2-1242, dated Jun. 30, 2010, 6 pages.

(Continued)

*Primary Examiner* — Steven B McAllister
*Assistant Examiner* — Helena Kosanovic
(74) *Attorney, Agent, or Firm* — Fish & Richardson P.C.

(57) ABSTRACT

A method for cooling electronic equipment can include flowing cooling air across a plurality of computer units and into a common warm air plenum located at a first end of the computer units; flowing air from the warm air plenum through one or more cooling units, and into an area located at a second end of the computer units; and controlling a flow rate of air out of the warm air plenum to maintain a predetermined pressure differential between the second end of the computer units and the first end of the computer units.

18 Claims, 13 Drawing Sheets

(56) References Cited

U.S. PATENT DOCUMENTS

| | | | |
|---|---|---|---|
| 7,011,576 B2 | 3/2006 | Sharp et al. | |
| 7,046,514 B2 | 5/2006 | Fink et al. | |
| 7,123,477 B2 | 10/2006 | Coglitore et al. | |
| 7,145,772 B2 | 12/2006 | Fink | |
| 7,173,821 B2 | 2/2007 | Coglitore | |
| 7,841,381 B2* | 11/2010 | Chagnot et al. | 165/8 |
| 2002/0007643 A1* | 1/2002 | Spinazzola et al. | 62/259.2 |
| 2002/0055329 A1* | 5/2002 | Storck et al. | 454/186 |
| 2004/0020224 A1 | 2/2004 | Bash et al. | |
| 2004/0099747 A1 | 5/2004 | Johnson et al. | |
| 2004/0997477 | 5/2004 | Johnson et al. | |
| 2005/0170770 A1* | 8/2005 | Johnson et al. | 454/184 |
| 2005/0225936 A1* | 10/2005 | Day | 361/687 |
| 2006/0082263 A1 | 4/2006 | Rimler et al. | |
| 2006/0181232 A1* | 8/2006 | Oljaca et al. | 318/268 |
| 2007/0254583 A1* | 11/2007 | Germagian et al. | 454/184 |

OTHER PUBLICATIONS

Cringley, Robert, "Google-Mart: Sam Walton Taught Google More About How to Dominate the Internet Than Microsoft Ever Did," I, Cringely—The Pulpit, Nov. 17, 2005, 3 pages.

Greg Matter Weblog, The Industrial Revolution, Finally, available at: http://blogs.sun.com/Gregp/date/200610, Oct. 17, 2006, 5 pages.

Hamilton, James, "An Architecture for Modular Data Centers" Microsoft Corp,CIDR 2007. 3rd Biennial Conference on Innovative Data Systems Research (CIDR) Jan. 7-10, 2007, Asilomar, California, USA pp. 306-313.

Hamilton, James, "Commodity Data Center Design" Microsoft Corp, Apr. 17, 2007, 11 pgs.

Rackable Systems, "Rackable Systems Contcentro Modular Data Center High Density, High Efficiency Mobile Computing," Datasheet, 2007, 1 page.

Rackable Systems, "Thermal Management & Server Density: Critical Issues for Today's Data Center," White paper, 2004 8 pages.

Sanmina-Sci Product Sheet, Ecobay, "High-Performance Closed-Loop System," 2006, 2 pages.

Shankland, Stephen, "Sun Blackbox, meet APC's whitebox," cNet News.com, available at http://news.com.com/Sun+Blackbox%2C+meet+APCs+whitebox/2001-10103_3-617774.html, Jan. 7, 2007, 2 pages.

Sun Project Blackbox—Index, Available at: http://www.sun.com/emrkt/blackbox/index.jsp, Retrieved Oct. 19, 2006, 3 pages.

Sun Project Blackbox—Scenarios, Available at: http://www.sun.com/emrkt/blackbox/scenarios.jsp, Retrieved Oct. 19, 2006, 7 pages.

"Protect High-Density Equipment From Thermal Damage—Guaranteed," APC Currents, vol. 18, No. 4, Sep. 2007, 3 pages.

* cited by examiner

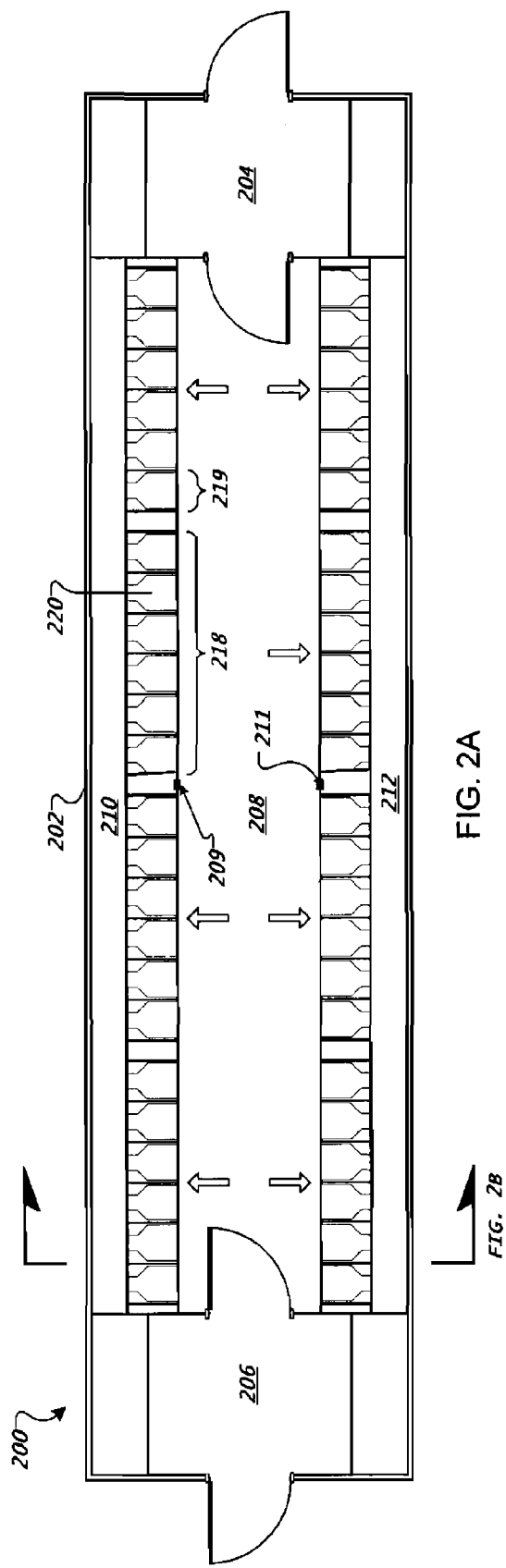
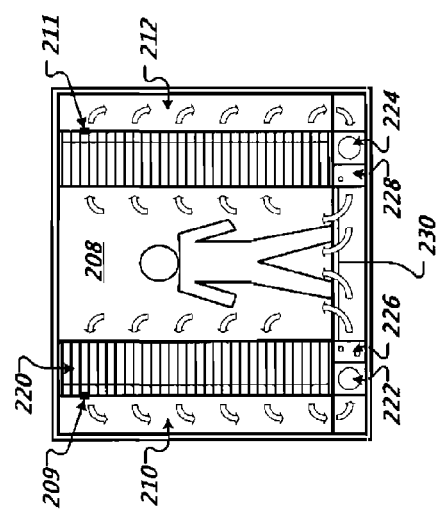
FIG. 2A
FIG. 2B

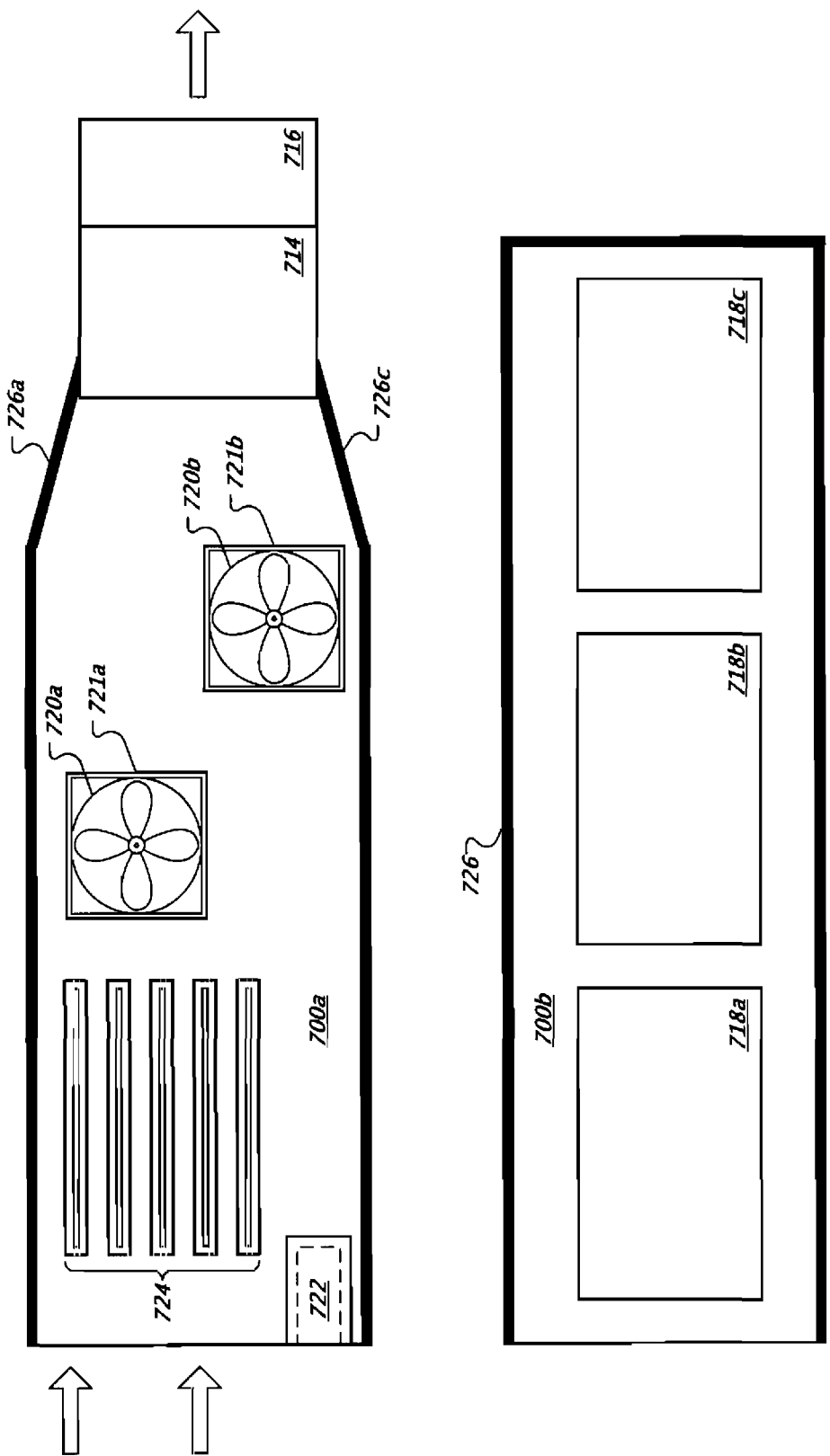

DATA CENTER AIR CIRCULATION

CROSS-REFERENCE TO RELATED APPLICATIONS

This application claims the benefit of prior U.S. provisional application 60/810,452, entitled "Controlled Warm Air Capture, and filed Jun. 1, 2006.

TECHNICAL FIELD

This document relates to systems and methods for providing cooling for areas containing electronic equipment, such as computer server rooms and server racks in computer data centers.

BACKGROUND

Computer users often focus on the speed of computer microprocessors (e.g., megahertz and gigahertz). Many forget that this speed often comes with a cost—higher power consumption. For one or two home PCs, this extra power may be negligible when compared to the cost of running the many other electrical appliances in a home. But in data center applications, where thousands of microprocessors may be operated, electrical power requirements can be very important.

Power consumption is also, in effect, a double whammy. Not only must a data center operator pay for electricity to operate its many computers, but the operator must also pay to cool the computers. That is because, by simple laws of physics, all the power has to go somewhere, and that somewhere is, in the end, conversion into heat. A pair of microprocessors mounted on a single motherboard can draw hundreds of watts or more of power. Multiply that figure by several thousand (or tens of thousands) to account for the many computers in a large data center, and one can readily appreciate the amount of heat that can be generated. It is much like having a room filled with thousands of burning floodlights. The effects of power consumed by the critical load in the data center are often compounded when one incorporates all of the ancillary equipment required to support the critical load.

Thus, the cost of removing all of the heat can also be a major cost of operating large data centers. That cost typically involves the use of even more energy, in the form of electricity and natural gas, to operate chillers, condensers, pumps, fans, cooling towers, and other related components. Heat removal can also be important because, although microprocessors may not be as sensitive to heat as are people, increases in temperature can cause great increases in microprocessor errors and failures. In sum, a data center requires a large amount of electricity to power the critical load, and even more electricity to cool the load.

SUMMARY

This document describes systems and methods that may be employed to remove heat efficiently from areas supporting electronic equipment, such as data centers. In certain implementations, circulation fans may be associated with particular boards or trays in a rack, and may be controlled to maintain a near-constant temperature for air exiting each of the boards. Fans may also be provided in a similar manner for a group of boards, such as a pair of adjacent boards. The heat from the boards, including from one or more racks that each include a plurality of boards, may be routed to a warm-air-plenum, through cooling coils, and into a workspace in a data center where people monitor and attend to the various computers. The air may then be circulated back across the boards, such as through open-front cabinets that make up the racks. The air may then continue to circulate over and over. The air on the back side of each tray may be maintained, by main circulating fans, at the same pressure (or near the same pressure) as the air on the front side of each tray, so that the trays can better control their own airflow, particularly at low flow rates.

Providing for control of the exhaust temperature of air leaving the boards, and holding the heated air in a separate space apart from the workspace can create separate zones having high associated thermal mass—i.e., the warm plenum and related areas, and the cooler workspace and related areas. As a result, these masses of air act like thermal capacitors. The warm air in the plenum area can be cooled more readily than could cooler air because the difference in temperature between the warm air and cooling water that is used to cool the air will be greater than it otherwise would be. In principle, the level of heat transfer between two zones (e.g., hot air and cooling water) is proportional to the difference in temperature between the zones, so that increasing the temperature difference also increases the heat transfer.

By controlling the board (e.g., server) exhaust temperatures, those temperatures may be driven upward by slowing the circulation of air across the board, thereby improving the heat transfer between the warmed air and any cooling fluid even more. Although one may seek to cool electronic components by forcing as much cool air as fast as possible over the components, more efficient (and still sufficient) cooling can be achieved at the system level by going in the opposite direction by slowing the circulation.

Such slow circulation may be aided by operating fans that pull air out of the warm air plenum and drive the air through the cooling coil so that each tray faces a constant pressure difference across it. As such, the fans on the trays will experience predictable operating parameters and can be operated relatively reliably at very low speeds and volumes. Also, controlling individual units such as a tray or group of trays to maintain a set exit temperature (and by extension, a set temperature rise), and controlling more general fans to maintain a set pressure difference (rather than temperature controlling those fans to a temperature or temperature difference), which may be zero, may help prevent the two components of the overall system from "fighting" with each other.

Various implementations may also provide for one or more of the following advantages. Simplified cooling schemes may be realized by maintaining constant exit temperatures for the various electronic components in a system. Also, elevated temperatures may be achieved in the air exiting the computer boards or trays, to permit for easier and more efficient cooling of that air. Moreover, because air may be provided to a workspace around the electronic equipment at a near-ambient temperature, much less mixing of air having varying temperatures occurs in the workspace than may be the case with other approaches to data center cooling. Finally, capturing the server exhaust in a warm air plenum and treating (cooling) it before releasing it into a facility results in much more predictable and uniform air temperatures at the inlet of the servers. This allows one to design for a lower average inlet temperature, rather than the peaks associated with releasing uncooled air from the servers back into the facility. In addition, segregation of warm air zones from cold air zones may help prevent thermal short circuits, where localized warm air may be pulled back through a rack.

In addition, because the air in the warm-air plenum and the workspace may serve as thermal capacitors that absorb changes in the system, changes in the conditions of the system, such as failed components, become less important. Also, other components of the system may be arranged so as to mask changes in the system, such as changes caused by the failure of certain components in the system. For example, if a particular cooling coil or fan fails or needs to be changed, the remaining coils or fans in a data room may make up the difference. In addition, use of common arrangements and control schemes across many components, such as for all boards in a data center, may allow equipment to be acquired as stock, rather than specialized, equipment, thereby lowering acquisition costs, and permitting more modular implementations that allow for efficient use of repetitive components. In addition, individual fans associated with particular trays in a rack of computers may be eliminated, with system fans providing motive force. Also, maintaining a relatively warm workspace (over or well over 75° and even warmer) or cold aisle, and an even warmer warm aisle can provide, in certain implementations (as described below), the advantages of not having to perform latent heat removal, and allowing different cooling plant technologies to dominate (cooling towers instead of chillers). In addition, elevated warm aisle, or warm air plenum, temperature can reduce the size of a cooling plant.

In some implementations, a method for cooling electronic equipment includes flowing cooling air across a plurality of computer units and into a common warm air plenum located at a first end of the computer units; flowing air from the warm air plenum through one or more cooling units, and into an area located at a second end of the computer units; and controlling a flow rate of air out of the warm air plenum to maintain a predetermined pressure differential between the second end of the computer units and the first end of the computer units.

The predetermined pressure differential can be approximately zero. The second end of the computer units can be open to a workspace of a data center, and the first end can be on an opposed end of the computer units from the second end. In some implementations, the method further includes measuring a pressure at the second end of the computer units with a pressure sensor in a workspace, and measure a pressure at the first end of the computer units with a pressure sensor in the warm air plenum.

Controlling the flow rate of air out of the warm air plenum can include controlling the speed of a plurality of plenum exhaust fans. The plurality of plenum exhaust fans can be connected to a single control point for a plenum. In some implementations, the method further includes controlling the flow of cooling air across a computer unit with one or more circulation fans controlled to maintain a set temperature rise across the computer unit. In some implementations, the set temperature rise is more than about 20 degrees Celsius.

In some implementations, a system for providing air circulation to rack-mounted computers includes a plurality of rack-mounted computer units, each computer unit having a front end near a workspace; a plurality of circulation fans mounted in proximity to the computer units to draw air across the computer units and into a common warm air plenum; and one or more warm air plenum fans controlled to maintain a set pressure differential between the workspace and the warm air plenum.

The system can further include one or more cooling coils controlled to cool air provided from the warm air plenum to the workspace.

In some implementations, the system further includes a control system for controlling the speed of the warm air plenum fans. In some implementations, the system further includes control systems associated with each of the plurality of circulation fans controlled to maintain a set temperature rise across each of the computers units. In some implementations, the control systems associated with each of the plurality of circulation fans do not communicate with the control system controlling the speed of the warm air plenum fans.

The plurality of rack-mounted computer units can be located across an open side wall of the warm air plenum. The rack-mounted computer units can include a plurality of horizontal motherboards mounted in a vertical stack. The plurality of circulation fans can be located to draw air across the computer units and then through power supplies associated with the computer units. The plurality of circulation fans can be mounted to the power supplies The details of one or more embodiments are set forth in the accompanying drawings and the description below. Other features, objects, and advantages will be apparent from the description and drawings, and from the claims.

DESCRIPTION OF DRAWINGS

FIG. 1b shows a front view of the tray in FIG. 1a.

FIG. 1c shows a side view of the tray in FIG. 1a.

FIG. 2a shows a plan view of a data center in a shipping container.

FIG. 2b shows a sectional view of the data center from FIG. 2a.

FIG. 3b shows a sectional view of the data center from FIG. 3a.

FIG. 4b shows a sectional view of the data center from FIG. 4a.

FIG. 5b shows a sectional view of the data center from FIG. 5a.

FIG. 7 shows plan views of two exemplary trays for use in a rack-mount computer system.

Like reference symbols in the various drawings indicate like elements.

DETAILED DESCRIPTION

Figure 1A:
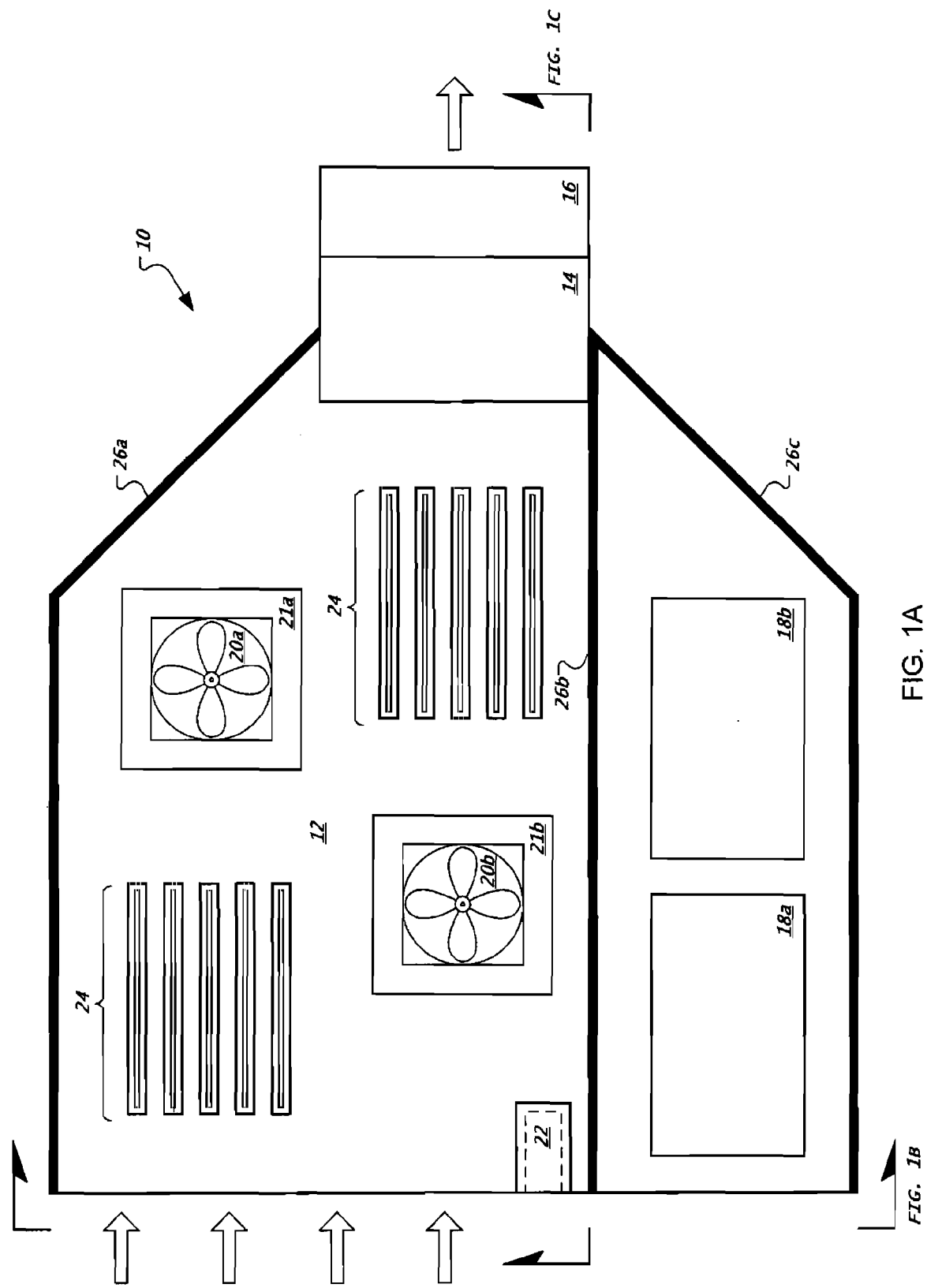
FIG. 1a shows a plan view of a tray in a rack-mount computer system.
Figure 1B:
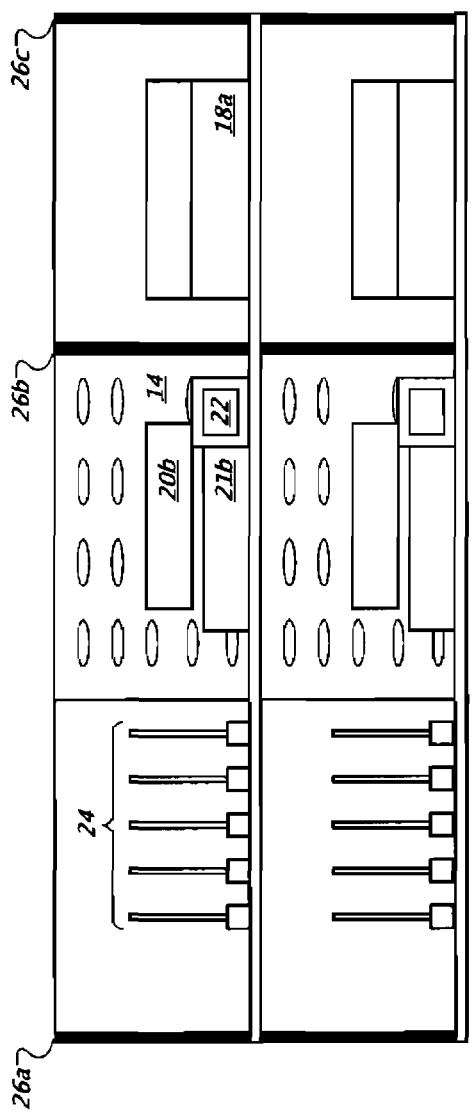
Figure 1C:
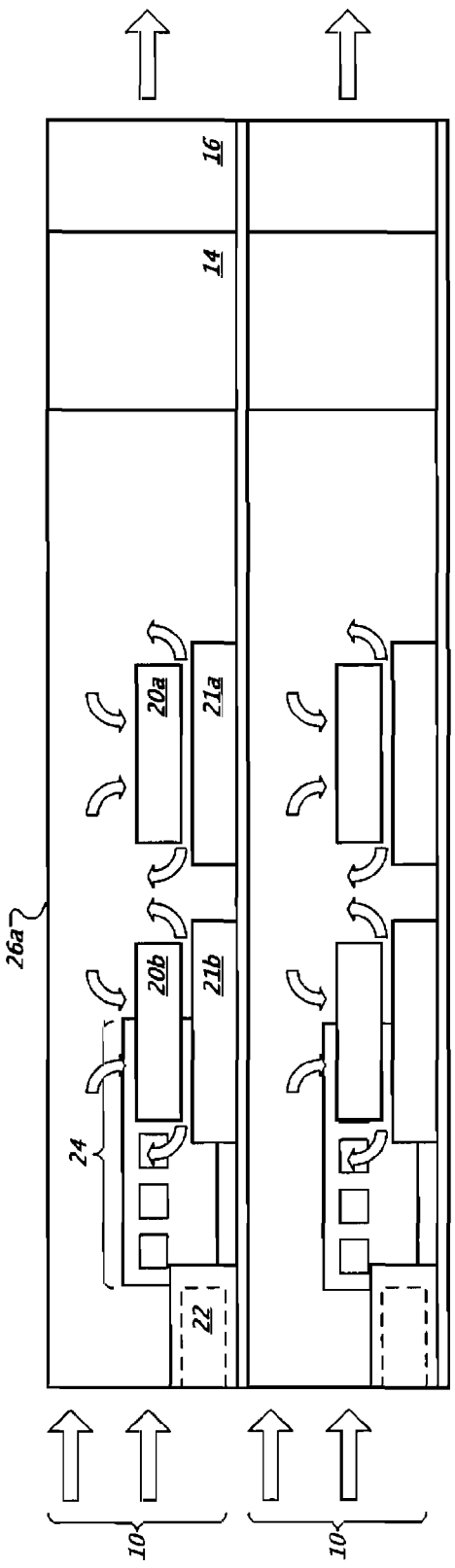

FIG. 1a shows a plan view of a tray 10 in a rack-mount computer system, while FIG. 1b shows a front view, and FIG. 1c shows a side view, of the tray 10 in FIG. 1a. The term "tray" is not limited to any particular arrangement, but instead includes any arrangement of computer-related components coupled together to serve a particular purpose, such as on a motherboard. Trays may be generally mounted parallel to other trays in a horizontal or vertical stack, so as to permit denser packing than would otherwise be possible with computers having free-standing housings and other components. The term "blade" may also be employed to refer to such apparatuses, though that term too should not be limited to a particular arrangement. Trays may be implemented in particular configurations, including as computer servers, switches (e.g., electrical and optical), routers, drives or groups of drives, and other computing-related devices. In general, the trays in a system take a standardized physical and electrical form to be easily interchangeable from one location in the system to another, but the trays may take other appropriate forms.

In general, the tray 10 may include a standard circuit board 12 on which a variety of components are mounted. The board 12 may be arranged so that air enters at its front edge (to the left in the figure), is routed over a number of heat generating components on the board 12, and is drawn through a power supply 14 and fan 16 before being exhausted from the tray 10. The fan 16 may also be arranged to push air through the power supply 14. In addition, the fan 16 may be located in other positions relative to the back edge of the tray and at locations away from a back edge of the tray 10. The power supply 14 may likewise be positioned at other locations and need not be joined to the fan 16.

In this arrangement, the heat from power supply 14 may be picked up after the heat from other components on the board 12 is picked up by the air flow. In this manner, the speed of fan 16 may be controlled to maintain a set temperature for the air exiting the board 12, or for temperatures at other points on the tray 10. For example, a thermocouple or other sort of temperature sensor may be placed in the air flow, such as upstream of the power supply 14 or downstream of the fan 16, and the fan speed may be modulated to maintain a set temperature. The temperature of the exiting air may also be highly elevated compared to systems that do not control airflow in this manner. It may be more efficient to cool this air than it would be to cool air that does not have such an elevated temperature.

Air may be routed over board 12 by walls 26a, 26b, 26c. Wall 26a may block one side of board 12, and may funnel air toward openings in power supply 14. Where the walls 26a, 26c do not taper, the air may otherwise be directed to the fan 16. Wall 26c may block one side of board 12, so as to prevent air from moving directly from the workspace into an area behind tray 10 (i.e., to the right in the figure). For example, a plenum may be provided behind multiple boards in the form of an open wall into which the boards may be placed, or in the form of a wall having multiple openings into which fans may be slid. In certain implementations, fully blocking or sealing of such a plenum may not be necessary, such as when the pressure difference between the plenum and the workspace is minimal.

Wall 26b separates one portion of tray 10 from another. In particular, wall 26b separates the portion of tray 10 containing heat generating components, such as microprocessors 21a, 21b, from components that generate substantially less heat, such as hard drives 18a, 18b. In making such a separation, wall 26b substantially blocks airflow over the components that generate less heat, and increases airflow over the heat generating components. In addition, wall 26b is arranged to route airflow into openings in power supply 14. Although not pictured, wall 26b may block areas on tray 10 but may provide that each blocked area (i.e., the area on each side of wall 26b) may still be in fluid communication with fan 16. For example, fan 16 may be designed to have openings that will lie on each side of wall 26b, and the openings may be sized or otherwise tuned so as to provide for relative levels of air flow on the opposing sides of the wall 26b. The "tuning" of the air flow may be made to match the relative thermal load of components on each side of wall 26b, so that more air flows on the side of wall 26b having the most thermal load, or that otherwise requires more cooling.

Board 12 may hold a variety of components needed in a computer system. As shown, board 12 holds a dual processor computer system that uses processor 21a and processor 21b connected to a bank of memory 24. The memory 24 may be in the form, for example, of a number of single in-line memory modules (SIMMs), dual in-line memory module (DIMMs), or other appropriate form. Other components of the computer system, such as chip sets and other chips, have been omitted for clarity in the figure, and may be selected and arranged in any appropriate manner.

Board 12 may also be provided with connections to other devices. Network jack 22, such as in the form of an RJ-45 jack or an optical networking connection, may provide a network connection for tray 10. Other connections may also be provided, such as other optical networking connections, video output connections, and input connections such as keyboard or pointing device connections (not shown).

Impingement fans 20a, 20b may be mounted above each microprocessor 21a, 21b, to blow air downward on the microprocessors 21a, 21b. In this manner, impingement fans 20a, 20b may reduce boundary layer effects that may otherwise create additional heat buildup on microprocessors 21a, 21b. As a result, lateral airflow across tray 10 can be reduced even further, while still adequately controlling the temperature rise to the microprocessors 21a, 21b.

Other heat relief mechanisms may also, or alternatively, be provided for microprocessors 21a, 21b. For example, one or more heat sinks may be provided, such as in the form of certain finned, thermally conductive structures. The heat sinks may be directly connected to microprocessors 21a, 21b, or may be located to the sides of microprocessors 21a, 21b, and may be attached by heat pipes to plates mounted to the top of microprocessors 21a, 21b. Thermally conductive grease or paste may be provided between the tops of microprocessors 21a, 21b, and any heat sinks to improve heat flow out of microprocessors 21a, 21b.

In operation, tray 10 may be mounted flat horizontally in a server rack such as by sliding tray 10 into the rack from the rack front, and over a pair of rails in the rack on opposed sides of the tray 10—much like sliding a lunch tray into a cafeteria rack, or a tray into a bread rack. Tray 10 may alternatively be mounted vertically, such as in a bank of trays mounted at one level in a rack. The front of the rack may be kept open to permit easy access to, and replacement of, trays and to permit for air to flow over the tray 10 from a workspace where technicians or other professionals operating a data center may be located. In this context, the term workspace is intended to refer to areas in which technicians or others may normally be located to work on computers in a data center.

After sliding a tray 10 into a rack, a technician may connect a tray to appropriate services, such as a power supply connection, battery back-up, and a network connection. The tray 10 may then be activated, or booted up, and may be communicated with by other components in the system.

Although tray 10 is shown in the figures to include a multiprocessor computer system, other arrangements may be appropriate for other trays. For example, tray 10 may include only hard drives and associated circuitry if the purpose of the tray is for storage. Also, tray 10 may be provided with expansion cards such as by use of a riser module mounted transversely to the board 12. Although particular forms of tray 10 may be provided, certain advantages may be achieved in appropriate circumstances by the use of common trays across a rack or multiple racks. In particular, great efficiencies may be gained by standardizing on one or a small handful of trays so as to make interaction between trays more predictable, and to lower the need to track and store many different kinds of trays.

A data center may be made up of numerous trays (hundreds or thousands), each mounted in one of numerous racks. For example, several dozen trays may be mounted in a single rack within a space, with approximately several inches between each tray. As explained in more detail below, each of the trays in a rack may back up to a warm air plenum that receives exhaust air from the trays and routes that air to a cooling unit that may re-circulate the air into the workspace in front of the racks.

Trays may also be packaged in groups. For example, two stacked trays may be matched as a pair, with one fan 16 serving both trays (not shown). Specifically, the fan 16 may be approximately double the height and diameter of a single tray unit, and may extend from the lower tray in a pair up to the top of the upper tray in a pair. By such an arrangement, the slowest turning portions of the fan, in the fan center, will be near the board of the top tray, where less airflow will normally occur because of boundary layer effects. The larger and faster moving portions of the fan 11 will be located nearer to the free areas of each tray 10 so as to more efficiently move air over the trays and through the respective power supplies more freely. In addition, a double-height fan may be able to move more air than can a single-height fan, at lower rotation speeds. As a result, a fan in such an arrangement may produce less noise, or noise at a more tolerable frequency, than could a smaller fan. Parallel fans may also be used to increase flow, and serial fans may be used to increase pressure, where appropriate.

Fan 16 may be controlled to maintain a constant temperature for air exiting fan 16 or at another point. By locating fan 16 downstream of power supply 14, and power supply 14 downstream of the other components of tray 10, the arrangement may maximize the heat rise across tray 10, while still maintaining adequately low temperatures for heat-sensitive components mounted to board 12, such as microprocessors 21a, 21b. Also, the power supply 14 may be less sensitive to higher temperatures than are other components, and so may be best located at the end of the air flow, where the temperatures are highest.

Although many applications seek to substantially increase airflow across heat generating components so as to increase the rate of heat dissipation from the components, the arrangement pictured here allows airflow across tray 10 to be slowed substantially to increase the temperature rise across tray 10. Increasing the temperature rise decreases the mass flow rate, and can make cooling across the entire system more efficient.

In particular, when the temperature of the warm exiting air is increased, the difference in temperature between the warm air and any cooling water entering a cooling coil to cool the warm air, also increases. The ease of heat transfer is generally directly proportional to this difference in temperature. Also, when the difference in temperature is relatively small, increasing the difference by only one or two degrees can produce a substantial increase in the amount of heat exchange between the warm air and the cooling water. As a result, a system run at higher exhaust temperatures from board 12 can provide substantial advantages in efficiency, and lower energy consumption.

In certain embodiments, the temperature rise across tray 10 may be approximately 20° C. As one example, air may enter the space above board 12 from a workspace at 25° C., and may exit fan 16 at 45° C. The entering temperature may also be about 21-30° C. (70-86° F.), and the exiting temperature 40-50° C. (104-122° F.). The 45° C. exhaust temperature or other temperature may be selected as a maximum temperature for which the components in tray 10 can be maintained without significant errors or breakdowns, or a safe temperature of operation. The 25° C. entering temperature or other temperature may be a temperature determined to create a comfortable or tolerable temperature in the workspace in a data center. The entering temperature may also be linked to a maximum allowable temperature, such as a federal or state OSHA-mandated maximum temperature. The entering temperature could be approximately 40° Celsius, which matches certain limits established by bodies governing workplace safety.

In other implementations, air may enter the space above board 12 at a temperature of 50° C., where appropriate thermal removal mechanisms or methods are provided for the components on board 12. For example, conductive and liquid-cooled components may be placed in contact with microprocessors 21a, 21b to increase the rate of heat dissipation from those components. Where a higher input temperature is selected, the temperature difference across tray 10 will generally be lower than if a lower input temperature is selected. However, heat will be easier to remove from such heated air when it passes through a cooling coil. Higher temperatures for expected breakdowns include components that tolerate case temperatures of 85 degrees Celsius. In addition, the exit air temperature from tray 10 may be as high as 75 degrees Celsius. An output temperature may be most easily controlled by locating a temperature sensor at the actual output (or aiming it at the actual output). Such an output temperature may also be controlled or maintained within an acceptable temperature range by placing a temperature sensor at a location away from the output, but where the difference in temperature is adequately predictable.

In the front view of FIG. 1b, one can see power supply 14 located at the back of tray 10, and perforated to permit the flow of air through power supply 14. In addition, one can see hard drive 18a located in an area walled off from the heat generating components of tray 10 by wall 26b. As noted above, the power supply 14 could also be situated so as to receive air leaving two different zones on tray 10, with the power supply 14 or other components tuned to maintain certain relative air flow rates from each side.

The side view of FIG. 1c shows more clearly the relationship of the impingement fans 20a, 20b and microprocessors 21a, 21b. The fans 20a, 20b are shown schematically for clarity. Air is pulled through the tops of fans 20a, 20b, and driven down against the top of microprocessors 21a, 21b. This process breaks up layers of warm air that may otherwise form above microprocessors 21a, 21b.

As noted above, other techniques for spot removal of heat from components such as microprocessors 21a, 21b may also be employed. As one example, heat sinks may be attached on top of or to the side of microprocessors 21a, 21b, and may be cooled by circulating air or a liquid, such as water or fluorinert liquid, or oils. Liquid supply and return tubes may be provided down each rack, with taps at which to connect pipes for cooling particular components. Circulation of liquid to the components may be driven by pressure created centrally in the system (e.g., from natural tap water pressure or large pumps) or by small pumps local to a particular tray 10. For example, small peristaltic, centrifugal, vane or gear-rotor pumps may be provided with each tray to create liquid circulation for the tray 10.

Alternatively, a portion of a rack or a component associated with a rack may be cooled, such as by passing liquid through passages in the component. Heat sinks for each heat generating component may then be coupled physically to the cooled component in the rack so as to draw heat out of the components on the tray 10 and into the rack. As one example, a vertical runner on the rack may be provided with clamps into which heat pipes attached to heat-generating components on tray 10 are received, so that the heat pipes may pull heat away from those components and into the runner. The runner may further include fluid passages to carry cooling fluid. Thus, the runner will be kept cool, and will draw heat by conduction from the heat-generating components.

Figure 1D:
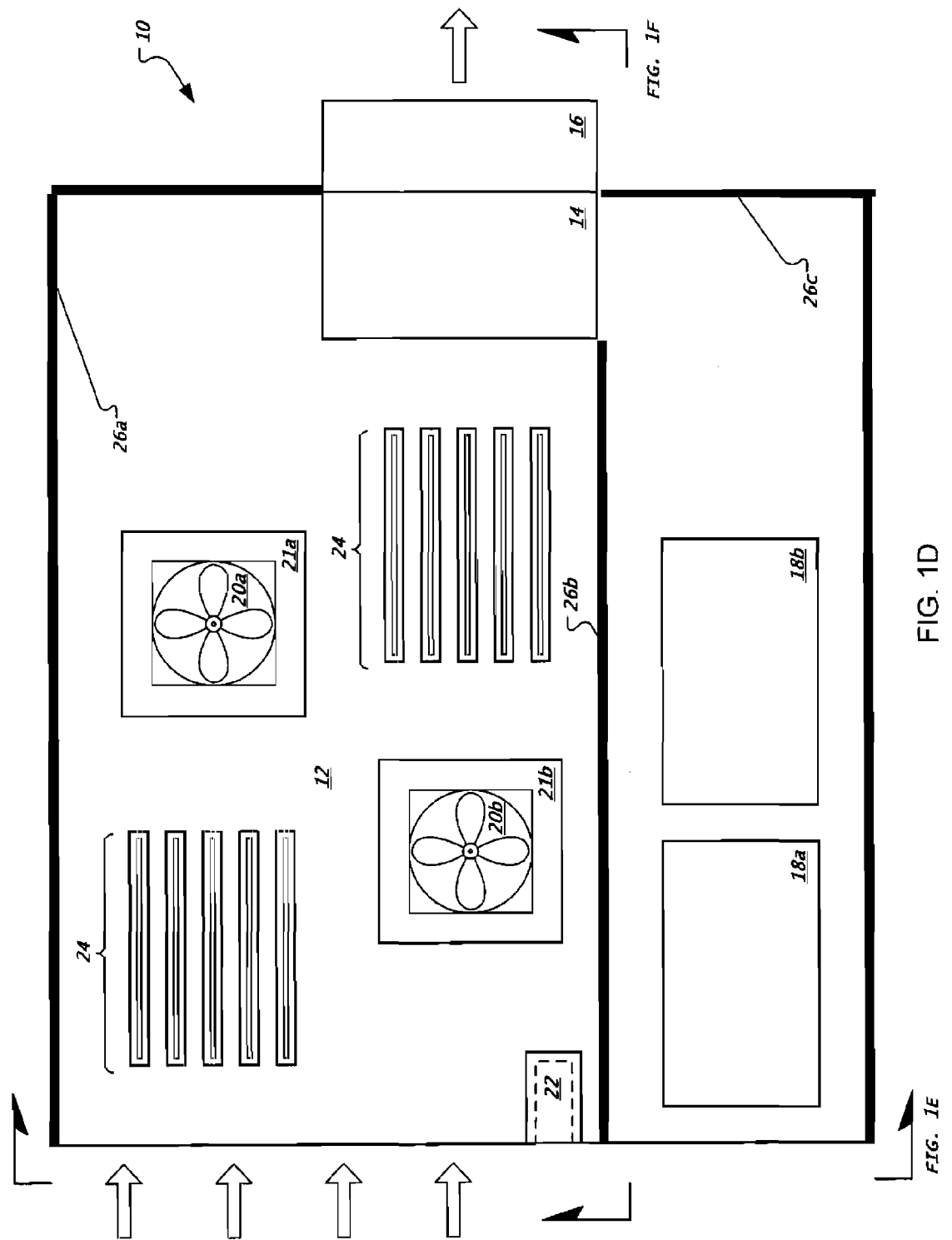
FIG. 1d shows a plan view of a tray in a rack-mount computer system, having dual-zone power supply ventilation.
Figure 1E:
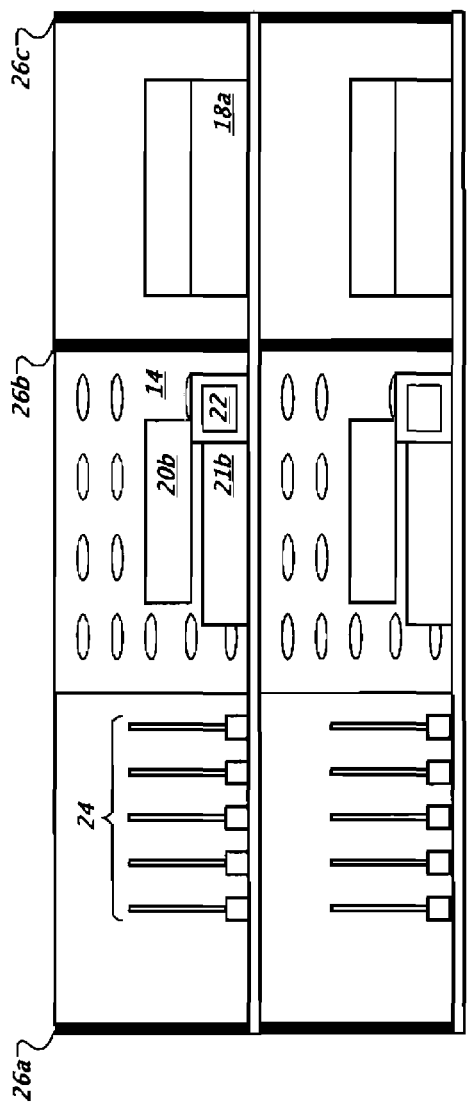
FIG. 1e shows a front view of the tray in FIG. 1d.
Figure 1F:
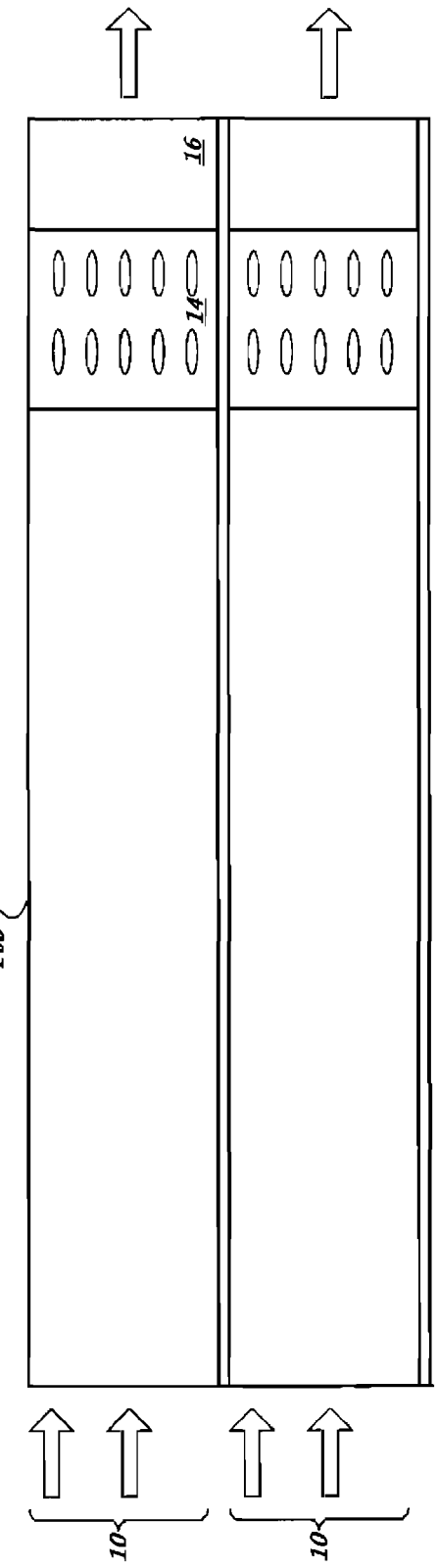
FIG. 1f shows a side view of the tray in FIG. 1d.

FIG. 1d shows a plan view of a tray in a rack-mount computer system, having dual-zone power supply ventilation. FIG. 1e shows a front view of the tray in FIG. 1d. FIG. 1f shows a side view of the tray in FIG. 1d. The general arrangement of components on the tray 10 here is similar to that in FIGS. 1a-1c, although the particular arrangement and layout of components is not generally critical. However, in these figures, the wall 26b has its rear edge pulled forward from the back wall of the tray 10. Also, the power supply 14 has two areas of openings—one on its front edge, as can be seen in FIG. 1E, and one on its side edge, as can be seen in FIG. 1F. The openings on the front edge generally provide ventilation for the hot side of the tray 10, while those on the side edge provide ventilation for the cool side of the tray 10.

The openings may be sized or otherwise organized to provide particular approximate levels of ventilation to each side of the tray 10. As can be seen in FIGS. 1E and 1F, the front edge of the power supply 1 has more holes than does the edge; in addition, the air flow from the front edge is straight, while air coming in through the side edge needs to curve. As a result, the front edge will provide a higher level of ventilation than will the side edge, and will thus be able to carry away the higher level of heat generated on the hot side of tray 10. The amount of air carried on a hot side might also be lower than on a cool side, such as where equipment requirements force the cool side to stay at a low temperature. In other words, in setting flow rates for each portion of tray 10, both heat generation and desired operating temperature may be taken into account.

Figure 1G:
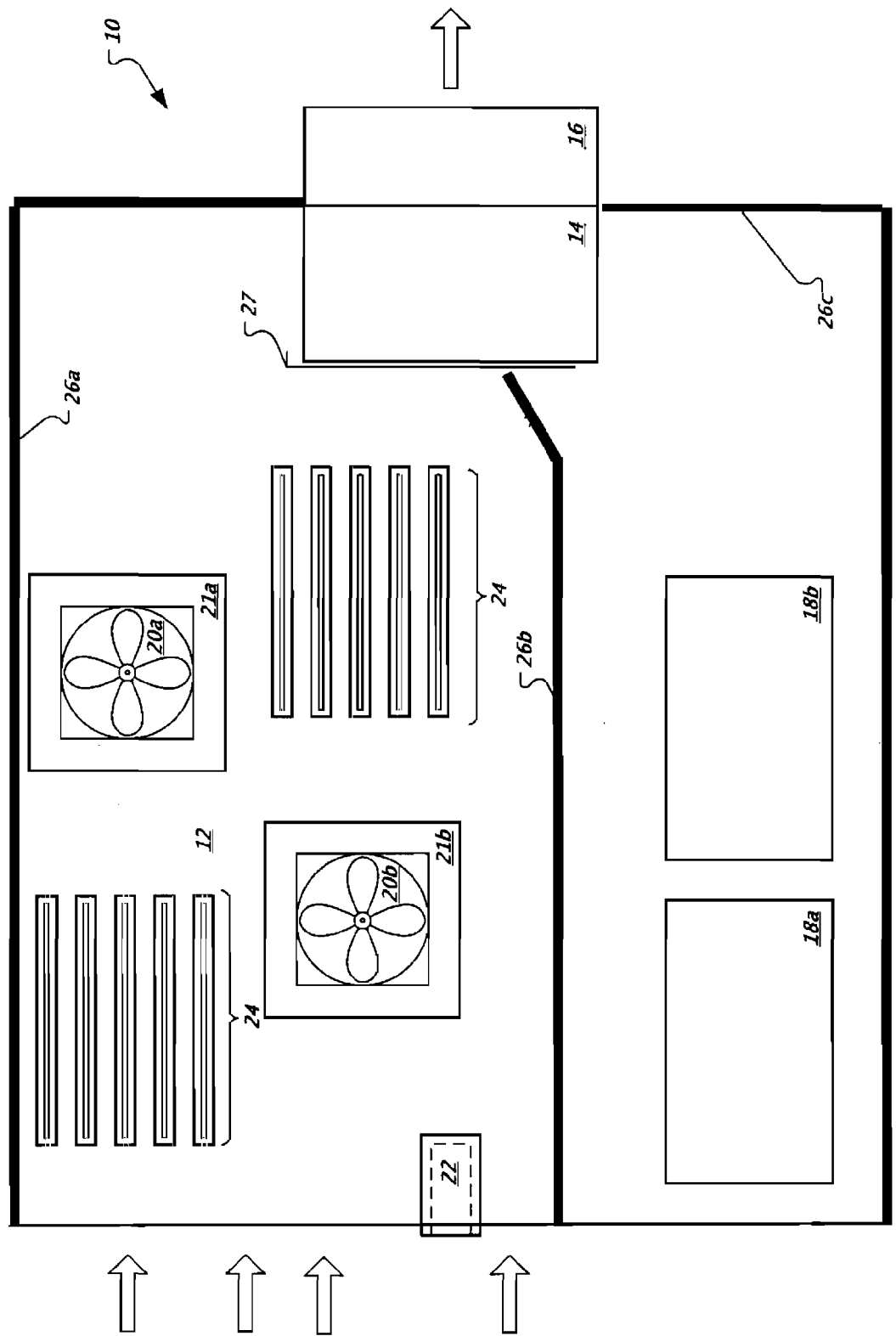
FIG. 1g shows a plan view of a tray in a rack-mount computer system, having dual-zone adjustable power supply ventilation.

FIG. 1g shows a plan view of a tray in a rack-mount computer system, having dual-zone adjustable power supply ventilation. Here, the wall 26b is positioned to direct a certain amount of ventilating air from each side of wall 26b. The wall 26b may be positioned on tray 10 at an appropriate position, and its terminal end may be made adjustable through pivoting or other mechanisms, so as to permit on-site adjustment of air flow.

In addition, gate 27 may be provided over a front surface of power supply 14 to provide adjustment to the size of openings on the front surface via openings in the gate 27 that form an interference pattern with openings on power supply 27 (much like the openings on certain spice containers). The interference pattern may be different for each side of tray 10, so that moving the gate 27 causes a greater effect on the airflow for one side of tray 10 than its does for the other side of tray 10.

Temperature-dependent mechanisms may also be provided to control the flow of air through power supply 14. For example, polymer or metallic materials that change shape with temperature may be used to form openings that close as their temperature falls—thereby driving back up the exit temperature of air from a particular portion of tray 10. As one example, the materials may produce a form of stoma that opens and closes. Also, mechanisms such as temperature-controlled louvers, or a temperature-controlled actuator on gate 27 may be used to control airflow over board 12. Such air control mechanisms may also be located off of tray 10. For example, a wall perforated by temperature dependent stoma (or other gates) may be placed behind a number of racks filled with trays, and may thereby control the exit temperature for all of the racks in a convenient manner. In such a situation, as in others discussed herein, fan 16 may be eliminated from tray 10, and a central ventilation system may pull air through the various trays and racks.

FIG. 2a shows a plan view of a data center 200 in a shipping container 202. Although not shown to scale in the figure, the shipping container 202 may be approximately 40 feet along, 8 feet wide, and 9.5 feet tall. Packaging of a data center in a shipping container may permit for more flexible and automated data center manufacture, such as by having a centrally-trained crew construct a large number of such data centers. In addition, the portability offered by a shipping container permits for quicker and more flexible deployment of data center resources, and thus allows for extension and projection of a network more easily to various areas.

The container 202 includes vestibules 204, 206 at each end. One or more patch panels or other networking components to permit for the operation of data center 200 may also be located in vestibules 204, 206. In addition, vestibules 204, 206 may contain connections and controls for the shipping container. For example, cooling pipes (e.g., from heat exchangers that provide cooling water that has been cooled by condenser water supplied from a source of free cooling such as a cooling tower) may pass through the end walls of a container, and may be provided with shut-off valves in the vestibules 204, 206 to permit for simplified connection of the data center to, for example, cooling water piping. Also, switching equipment may be located in the vestibules 204, 206 to control equipment in the container 202.

A central workspace 208 may be defined down the middle of shipping container 202 as an aisle in which engineers, technicians, and other workers may move when maintaining and monitoring the data center 200. For example, workspace 208 may provide room in which workers may remove trays from racks and replace them with new trays. In general, workspace 208 is sized to permit for free movement by workers and to permit manipulation of the various components in data center 200, including to provide space to slide trays out of their racks comfortably.

A number of racks such as rack 219 may be arrayed on each side of workspace 208. Each rack may hold several dozen trays, like tray 220, on which are mounted various computer components. The trays may simply be held into position on ledges in each rack, and may be stacked one over the other. Individual trays may be removed from a rack, or an entire rack may be moved into workspace 208.

The racks may be arranged into a number of bays such as bay 218. In the figure, each bay includes six racks and may be approximately 8 feet wide. The data center 200 includes four bays on each side of workspace 208. Space may be provided between adjacent bays to provide access between the bays, and to provide space for mounting controls or other components associated with each bay. Various other arrangements for racks and bays may also be employed as appropriate.

Warm air plenums 210, 212 are located behind the racks and along the exterior walls of the shipping container 202. The warm air plenums receive air that has been pulled over trays, such as tray 220, from workspace 208. The air movement may be created by fans such as fan 16 in FIGS. 1a-1c. Where each of the fans on the associated trays is controlled to exhaust air at one temperature, such as 45° C., the air in plenums 210, 212 will generally be a single temperature or almost a single temperature. As a result, there will be little need for blending or mixing of air in warm air plenums 210, 212.

FIG. 2b shows a sectional view of the data center from FIG. 2a. This figure more clearly shows the relationship and airflow between workspace 208 and warm air plenums 210, 212. In particular, air is drawn across trays, such as tray 220, by fans at the back of the trays. Although shown earlier as fans associated with single trays or a small number of trays, other arrangements of fans may also be provided. For example, larger fans or blowers, such as air induction blowers, may be provided to serve more than one tray.

Air is drawn out of warm air plenums 210, 212 by fans 222, 224, respectively. Fans 222, 224 may take various forms. In one exemplary embodiment, fans 222, 224 may be in the form of a number of squirrel cage fans. The fans 222, 224 may be located along the length of container 202, and below the racks, as shown in the figure. A number of fans may be associated with each fan motor, so that groups of fans may be swapped out if there is a failure of a motor or fan.

An elevated floor 230 may be provided at or near the bottom of the racks, on which workers in workspace 208 may stand. The elevated floor 230 may be formed of a perforated material, of a grating, or of mesh material that permits air from fans 222, 224 to flow into workspace 208. Various forms of industrial flooring and platform materials may be used to produce a suitable floor that has low pressure losses.

Fans 222, 224 may blow heated air from warm air plenums 210, 212 through cooling coils 226, 228. Cooling coils 226, 228 may be sized using well known techniques, and may be standard coils in the form of air-to-water heat exchangers providing a low air pressure drop, such as a 0.1 inch pressure drop. Cooling water may be provided to coils 226, 228 at a temperature, for example, of 20 degrees Celsius, and may be returned from coils 226, 228 at a temperature of 40 degrees Celsius. In other implementations, cooling water may be supplied at 15 degrees Celsius or 10 degrees Celsius, and may be returned at temperatures of about 25 degrees Celsius, 30 degrees Celsius, 35 degrees Celsius, 45 degrees Celsius, 50 degrees Celsius, or higher temperatures. The position of the fans 222, 224 and coils 226, 228 may also be reversed, so as to give easier access to the fans for maintenance and replacement. In such an arrangement, the fans 222, 224 will draw air through the coils 226, 228.

The particular supply and return temperatures may be selected as a parameter or boundary condition for the system, or may be a variable that depends on other parameters of the system. Likewise, the supply or return temperature may be monitored and used as a control input for the system, or may be left to range freely as a dependent variable of other parameters in the system. For example, the temperature in workspace 208 may be set, as may the temperature of air entering plenums 210, 212. The flow rate of cooling water and/or the temperature of the cooling water may then vary based on the amount of cooling needed to maintain those set temperatures.

The particular positioning of components in shipping container 202 may be altered to meet particular needs. For example, the location of fans 222, 224 and coils 226, 228 may be changed to provide for fewer changes in the direction of airflow or to grant easier access for maintenance, such as to clean or replace coils or fan motors. Appropriate techniques may also be used to lessen the noise created in workspace 208 by fans 222, 224. For example, placing coils in front of the fans may help to deaden noise created by the fans. Also, selection of materials and the layout of components may be made to lessen pressure drop so as to permit for quieter operation of fans, including by permitting lower rotational speeds of the fans.

Also, the fans may pull air or push air through the coils. Pushing air may have the advantage of being quieter, as the coils may block out a certain amount of the fan noise. Also pushing of air may be more efficient. Pulling of air may provide a benefit of allowing a limited number of fans to operate on a much larger bank of coils, as all the pulling fans can be connected to a plenum, and may create a relative vacuum behind the coils to pull air through. In such an arrangement, if one of the fans breaks down, the others can more easily provide support across the entire coil length.

Airflow in warm air plenums 210, 212 may be controlled via pressure sensors 209, 211. For example, the fans 222, 224 may be controlled so that the pressure in warm air plenums 210, 212 is roughly equal to the pressure in workspace 208. The volume on one side of pressure sensors 209, 211 may be the warm-air plenum, and the volume on the other side may be the workspace 208; where a common barrier between these spaces is not available, taps may be provided to permit sensing of pressure in each volume. More precisely, the pressure where the air leaves the tray 220 may be kept roughly equal to the pressure where it enters the tray, or a set difference in pressures other than zero may be maintained. Where such a pressure relationship is maintained, each of the fans that draw air across the trays 220 (where each tray may have one or more dedicated fans) may "see" a uniform and predictable world around it. As a result, the airflow across each tray 220 may likewise be more uniform and predictable, so that adequate airflow can be maintained, adequate cooling can be maintained by extension, fewer hotspots will arise, and fewer equipment failures will result. In addition, such a system may better isolate problems in one area of the system from operations in other areas, so that the system has better "diversity" of operation.

Pressure sensors 209, 211 may be, for example, differential pressure sensors such as the Setra Model 263 differential pressure transducer. Taps for the pressure sensors 209, 211 may be placed in any appropriate location for approximating a pressure differential across the trays 220. For example, one tap may be placed in a central portion of plenum 212, while another may be placed on the workspace 208 side of a wall separating plenum 212 from workspace 208. The pressure differential between workspace 208 and plenums 210, 212 may be maintained, for example, at about $20/1000$ths of an inch of static pressure, with the slight vacuum on the plenum side. In general, the sensors 209, 221 may be operated in a conventional manner with a control system to control the operation of fans 222, 224. For example, variable speed drives may be used to increase or decrease the speed of the fans 222, 224 to maintain a particular pressure differential, such as zero or nearly zero differential. One sensor may be provided in each plenum, and the fans for a plenum or a portion of a plenum may be ganged on a single control point.

Controlling pressure in the warm air plenum relative to the pressure on the intake side of the racks, including when the racks are open to a workspace, can, in certain configurations, provide one or more advantages. For example, each tray can better control its own environment because it operates, airflow-wise, as if it is located in an open room—it sees a consistent and predictable pressure difference, of approximately zero in certain implementations, on each of its ends. As a result, each tray can more closely match its operation to its own heat loads. In addition, the operation of each tray is also made much less dependent on the operation of other trays. Multiple groups of trays may also be controlled together, if a particular configuration calls for such grouping.

By making the entry and exit pressures for a tray or board predictable, fans for the tray or board may be run more slowly, and higher temperature rises (which can result in more efficient system-side cooling) across the tray or board may be achieved. In contrast, if the plenum fans 222, 224 are controlled based on plenum temperatures, those fans may be run too fast. For instance, an operator of such a system may seek to prevent stagnation of airflow on any board so as to prevent component burnout. To do so, the operator may seek to ensure that the plenum does not provide backpressure to any board. And to do that, the operator may set the temperature of the warm air plenum fairly low so that more air than necessary is pulled by the plenum fans 222, 224. Such operation will tend to draw air out of the trays and racks, and may defeat attempts by individual racks to maintain low air flow rates and high temperature rises across the trays or boards.

In addition, pressure is generally consistent across a space, whereas temperature differences may be much more localized. As a result, the location of pressure sensors 209, 211, may be less important than would be the particular location of temperature sensors. That may be especially true at the intake side of the trays, such as in the workspace 208, because air velocities are relatively slow there and are likely to create higher temperature differences across space due to less blending in the slower moving air.

In addition, use of pressure as a control signal for the plenum fans may permit for lower capital costs. As one example, the warm air plenum may generally be made smaller when a system is well balanced, which can save on floor space and permit more equipment to be installed in a data center. Also, with the ability to cover problems with one fan using other fans, the various fans can be sized smaller and individually less reliable, and thus acquired for less money. In addition, where the warm air plenum is roughly matched in pressure with the surrounding spaces, such as a workspace, the sealing of components for air leakage is less critical, so that savings may be achieved in labor, maintenance, and goods for such sealing.

Such an implementation also permits for more flexibility in planning and operating a data center. For planning, various unmatched trays may be inserted into a system without as much concern for how each will respond to the system, or will affect each other, because each simply needs to be able to control its own individual airflow and deal with what appears to be a neutral surrounding.

For operation, the system may better isolate problems in one area from other components. For instance, if a particular rack has trays that are outputting very warm air, such action will not affect a pressure sensor in the plenum (even if the fans on the rack are running at high speed) because pressure differences quickly dissipate, and the air will be drawn out of the plenum with other cooler air. The air of varying temperature will ultimately be mixed adequately in the plenum, in a workspace, or in an area between the plenum and the workspace. Also, if one plenum fan goes down, the other fans will simply speed up to maintain the pressure differential and to thereby move the same amount of air. In other words, the fans across the plenum will generally share the increased load equally.

Figure 2C:
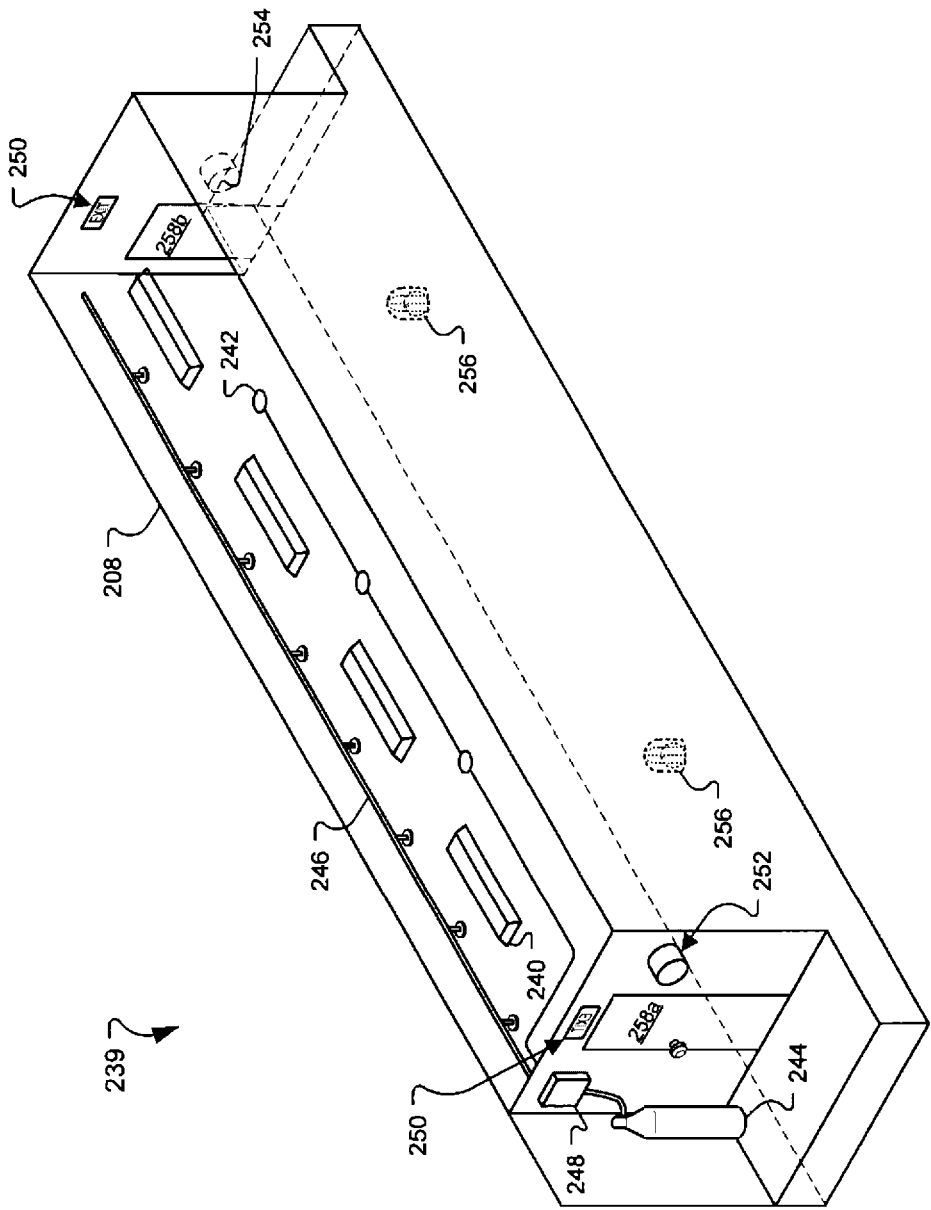
FIG. 2c shows a perspective view of a modular computing environment for housing a data center or part of a data center.

FIG. 2c shows a perspective view of a modular computing environment 239 for housing a data center or part of a data center. The modular computing environment 239 may be housed, in whole or in part, in container 208, which may be a standard shipping container, or may take other appropriate forms. This figure better shows features in container 208 to permit human occupancy, which may be of assistance in servicing the computing environment in the container 208. Such human occupancy may require additional features that satisfy both physical human occupancy requirements and any legal requirements that may exist (e.g., municipal building or occupancy requirements).

For example, the modular computing environment 239 provides a mechanism for human ingress into and egress out of the interior of the enclosure (e.g., by doors 258a, b). Lights 240 may be provided in the interior, as may be a source of fresh air and fire detection and suppression systems 242. The interior may be further designed within certain temperature, humidity, and noise parameters, and a clearance may be provided to allow human operators to move about the interior to maintain or service various components, such as shown in FIGS. 2A and 2B.

The modular computing environment 239 may further be designed to account for safety of human operators in the enclosure. For example, power sources may be covered and insulated to minimize risk of electrical shorting or shocks to human operators; fans may be enclosed within protective cages to contain fan blades that may cause injury when coming into contact with, for example, a human finger or other appendage; and the interior may be equipped with emergency lighting and exit signs 250. A removable, sectioned walkway (e.g., a metal grate (not shown)) may be provided to allow human operators to walk along the length of the modular computing environment 239 and to access components below the walkway (e.g., heat exchangers/coils or fans, in some implementations).

The systems may require, in certain implementations, features that meet physical requirements of human occupancy (e.g., systems that regulate temperature, noise, light, amount of fresh air, etc.) Moreover, depending on its location, the modular computing environment 239 may fall under the jurisdiction of a local municipality as an inhabitable commercial or industrial structure, and various systems may be required to meet local building or occupancy codes (i.e., legal requirements of human occupancy).

As shown, the systems include lighting 240, fire/smoke detectors 242, and a fire suppression system 246. In some implementations, the fire suppression system 246 may include an inert chemical agent or water fog fire suppressant. The chemical fire suppressant may be stored in an on-board tank 244, or the water fog fire suppressant may be provided by a source external to the modular computing environment 239. A controller 248 may cause the chemical fire suppressant to be released based on input from the fire/smoke detectors 242. As shown, a number of fire suppressant heads are shown along the top of the modular computing environment 239; in some implementations, more or fewer heads may provided. For example, a fog-based fire suppression 246 system may only include a small number of heads. In some implementations, the fire suppression system 246 may be arranged in a different manner; for example, each rack may include its own fire suppression subsystem.

Human occupancy regulations may require exit lights 250 and certain ingress and egress parameters (e.g., number, placement and size of doors 258a, 258b). A fresh air circulation system 252, 254 may also be required to supply the interior of the modular computing environment 239 with fresh air. Also, drains 256 may be provided to dispose of water that may enter the container or may leak, such as from cooling or sprinkler piping.

Figure 3A:
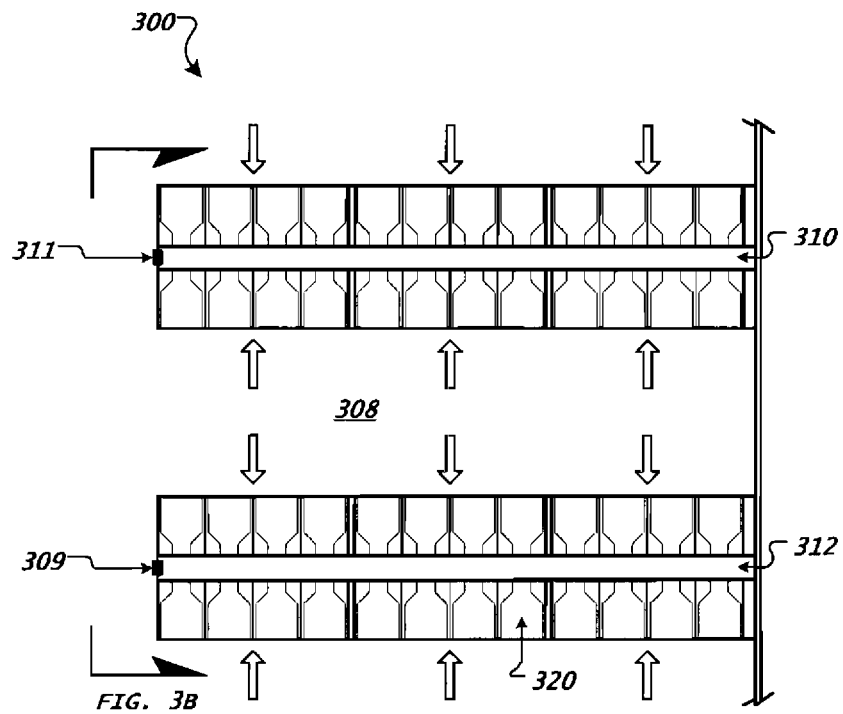
FIG. 3a shows a plan view of a data center.
Figure 3B:
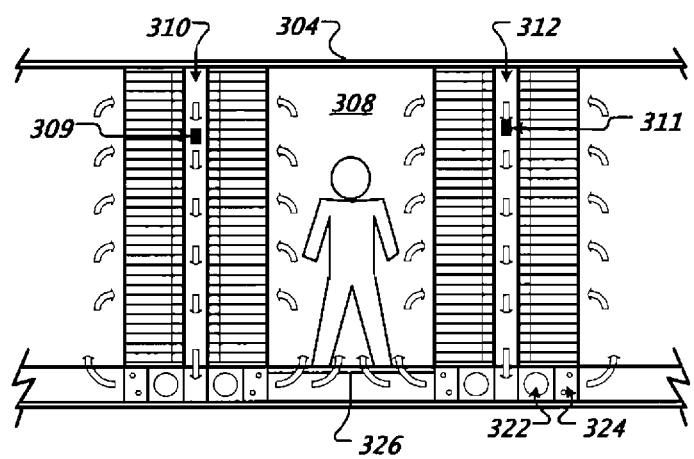

FIG. 3a shows a plan view of a data center 300, and FIG. 3b shows a sectional view of the data center 300 from FIG. 3a. Data center 300 is similar to data center 200 from FIGS. 2a-2b. However, data center 300 is shown located in a larger space, such as in a fixed building. Because of the additional space in this layout, racks of trays, such as tray 320, are mounted back-to-back on common warm-air plenums 310, 312. Air from plenums 310, 312 is routed downward below a false floor and driven back into workspace 308 by fans, such as fan 322, and through coils, such as cooling coil 324.

Again, an open platform 326 is provided on which workers in workspace 308 may stand when monitoring or maintaining computers in the racks, such as rack servers. The rack servers may run from the floor up to or near ceiling 304, which may be a drop tile ceiling, for example, at a height of approximately 8 feet. The ceilings may also be much higher, such as if the plenums 310, 312 are capped.

In these figures, the racks are formed in bays having four racks for each bay, and a per-bay length of approximately 6 feet. Other rack arrangements may also be employed so as to fit the needs and dimensions of a particular data center implementation.

The pictured implementation and similar implementations may provide for scalability of data center 300. For example, additional rows of computer racks may be added in parallel, either to provide for a larger data center or to expand an existing data center. Relatively simple circulation units (such as those just described) may be installed under the racks and may require only water piping connections and electrical connections for operating the fans. Thus, those components also permit for simplified maintenance and installation of components for the system. For example, standardized components such as fan coil units may be manufactured and assembled at a central location and then shipped to a data center worksite for installation. In addition, worn or broken components may be removed and switched with newer components. Moreover, use of common components permits the operation of a data center with fewer replacement components on hand and also permits use of general stock components available from many manufacturers and distributors.

Pressure sensors 309, 311 may also be provided to control the operation of fans 322. As shown, the pressure sensors 309, 311 are shown mounted directly in an endwall of plenums 310, 312, so as to provide a differential pressure between a warm air plenum 310, 312 and a workspace 308, but may be located in other areas, and may be provided with extension tubing so that sensing taps may be placed in any convenient location. The sensors 309, 311 may be used to control the system 300 in ways like those discussed above for sensors 209, 211 in FIGS. 2A and 2B. For example, fans like fan 322 may be controlled to maintain a set pressure difference, such as zero, between the plenums 310, 312 and the workspace 308.

Figure 4A:
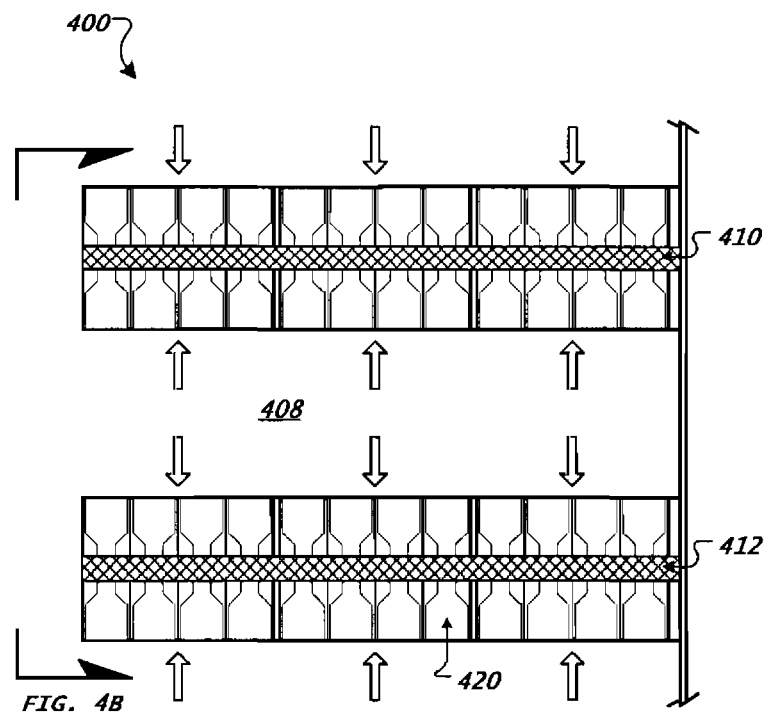
FIG. 4a shows a plan view of a data center.
Figure 4B:
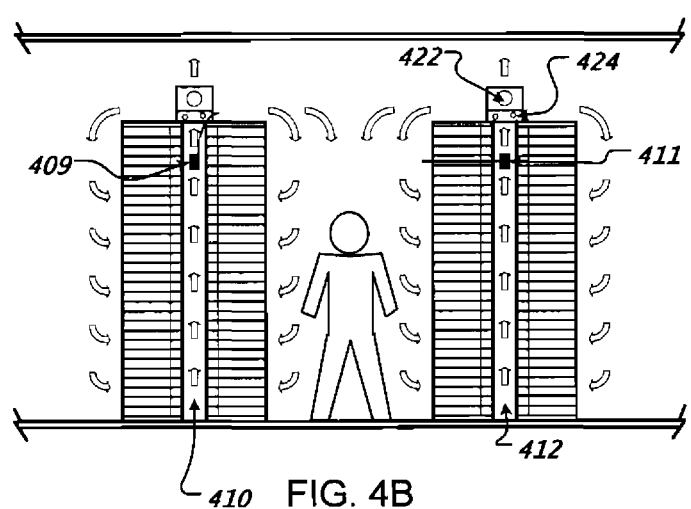

FIG. 4a shows a plan view of a data center 400, and FIG. 4b shows a sectional view of the data center 400 from FIG. 4a. The data center 400 is similar to data center 300 shown in FIGS. 3a-3b, but with the locations of the fan-coil units changed. Specifically data center 400 is configured to be located in a fixed building and to be expandable in manners similar to data center 300. In addition, data center 400, like datacenter 300, includes pairs of racks having trays such as tray 420 (which may include, e.g., a computer motherboard and associated components), mounted back-to-back, separated by intervening workspaces such as workspace 408.

However, in data center 400, fan 422 and coil 424 are mounted at the top of warm air plenum 412, as are other fans and coils. In this arrangement, air may be expelled from the fans across the ceiling and need not turn as many corners as in the implementation of FIGS. 3a-3b. In other implementations, fan 422 may push air through the coil 424. Likewise, coil 424 may be located away from the racks so as to reduce the risk that water in the coil 424 will leak onto the racks. In addition, along the length of the racks, the fans and coils may point in alternating directions, so that some fans blow into the workspace to the right of a rack and some blow into the workspace to the left of the rack.

Pressure sensors 409, 411 may also be provided to control the operation of fans 422. In the figures, the pressure sensors 409, 411 are shown mounted within plenums 410, 412 to sense the pressures in the plenums 410, 412, and are provided with tubed extensions that sense pressure in the workspace 408. The sensors 409, 411 may be used to control the system 300 in ways like those discussed above for sensors 209, 211 in FIGS. 2A and 2B.

Figure 5A:
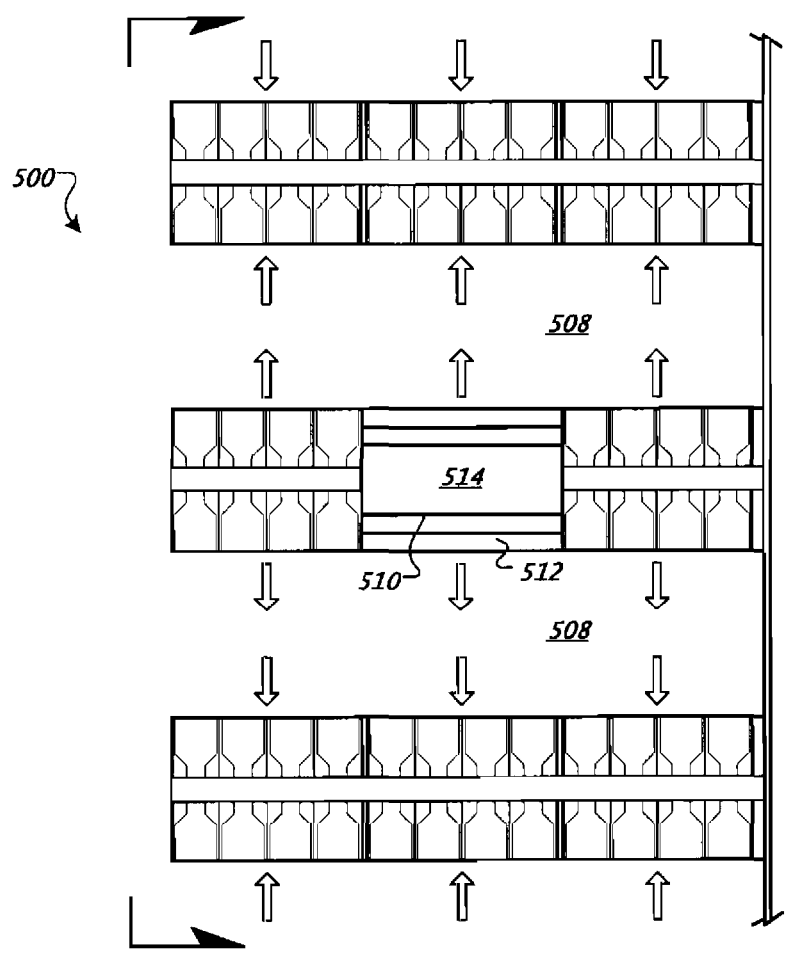
FIG. 5a shows a plan view of a data center.
Figure 5B:
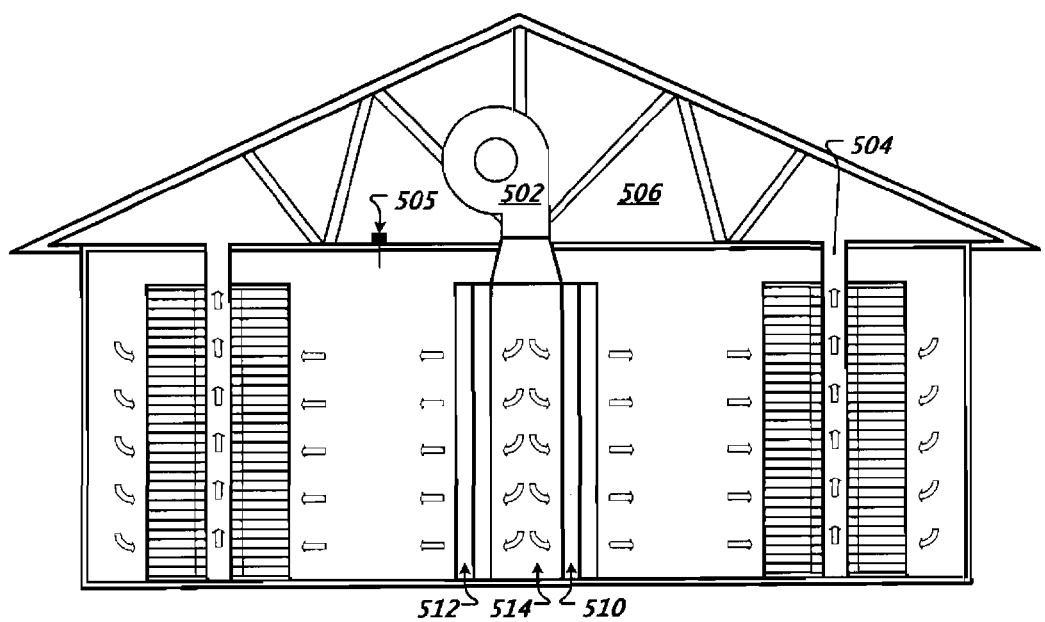

FIG. 5a shows a plan view of a data center 500, and FIG. 5b shows a sectional view of the data center 500 from FIG. 5a. In this implementation, individual fan-coil units near each rack have been replaced with a single central unit in the middle of data center 500. The air that has warmed by passing through the racks may be drawn upward through passages in the form of chimney 504, into an attic space 506. The chimney 504 may be in the form of a number of passages, such as round or rectangular ducts, or may be in the form of a passage that runs the entire length of a row of trays, or may take another appropriate form. Advantageously, the attic space may be naturally warm from the outdoor environment and from radiated heat transfer from the sun, so that little to no heat will be transmitted through the roof into the attic. In appropriate circumstances, the warmed air entering the attic 506 may be at a higher temperature than the outdoor temperature, and heat transfer may occur out of the attic, rather than in.

Warm air is drawn from attic space 506 by supply fan 502, which may be located above an area near the center of data center 500. Locating fan 502 in attic space 506 may reduce the noise level transmitted from fan 502 into workspace 508. Other sound insulation techniques may also be used such as by insulating the ceiling of workspace 508. Such insulation may also provide thermal insulation that prevents heat from passing downward through the ceiling.

Fan 502 may connect to a plenum 514, such as a plenum that takes the place of a pair of back-to-back bays. The plenum 514 may be formed from an enclosure that seals the plenum 514 from adjacent racks. The sides of the enclosure may be covered with cooling coils such as coil 510. Cooling water may be passed through cooling coil 510 under conditions like those discussed above. Cooling coils 510 may be sized and selected to have relatively shallow fins, so as to present a minimal pressure drop. Fan 502 may alternatively be located, for example, in the area taken up by plenum 514 in the figure.

Mechanisms for obtaining outdoor air into the attic 506 or another area may also be provided. For example, motor-controlled louvers to the outdoors may be provided and may be caused to take in outside air when atmospheric conditions are favorable (e.g., low temperature and low humidity). Air filtering may be performed on incoming fresh air. Such fresh or outside air may be blended with heated, re-circulating air from the space also. The amount of such blending may be controlled electronically to produce desired temperature or other values in the space. In addition, separate air-conditioning units may also be provided to provide supplemental or spot cooling, and to remove any built-up latent heat. When operating in such an air-side economizing mode, exhaust fans may also be provided to remove, for example, heated air, and may be controlled via differential pressure sensors to coordinate their operation with other components in the system. In addition, appropriate filtration and humidity control may be provided for air entering a system from the outdoors.

Heat transfer to cooling coil 510 may be improved where heat rise through the trays is high, and air-flow volumes are therefore relatively low. As a result, the volume of air moving through cooling coils 510 will also be relatively low, so that additional heat may be transferred from the warm air into the cooling water in cooling coil 510. Protective panel 512, such as a louver or a protective wire mesh screen, may be provided in front of cooling coil 510 to prevent workers from accidentally bending fins in the cooling coil. In addition, redirecting vanes (not shown) may be provided in plenum 514 to direct air laterally through cooling coils 510, 512.

Pressure sensor 505 may also be provided to control the operation of fan 502. In the figures, the pressure sensor 505 is shown mounted within plenum 506 to sense the pressure in the plenum 506, and is provided with a tubed extensions that passes into the workspace to sense pressure in the workspace 408. The sensor 505 may be used to control the system 500 in ways like those discussed above for sensors 209, 211 in FIGS. 2A and 2B.

Figure 5C:
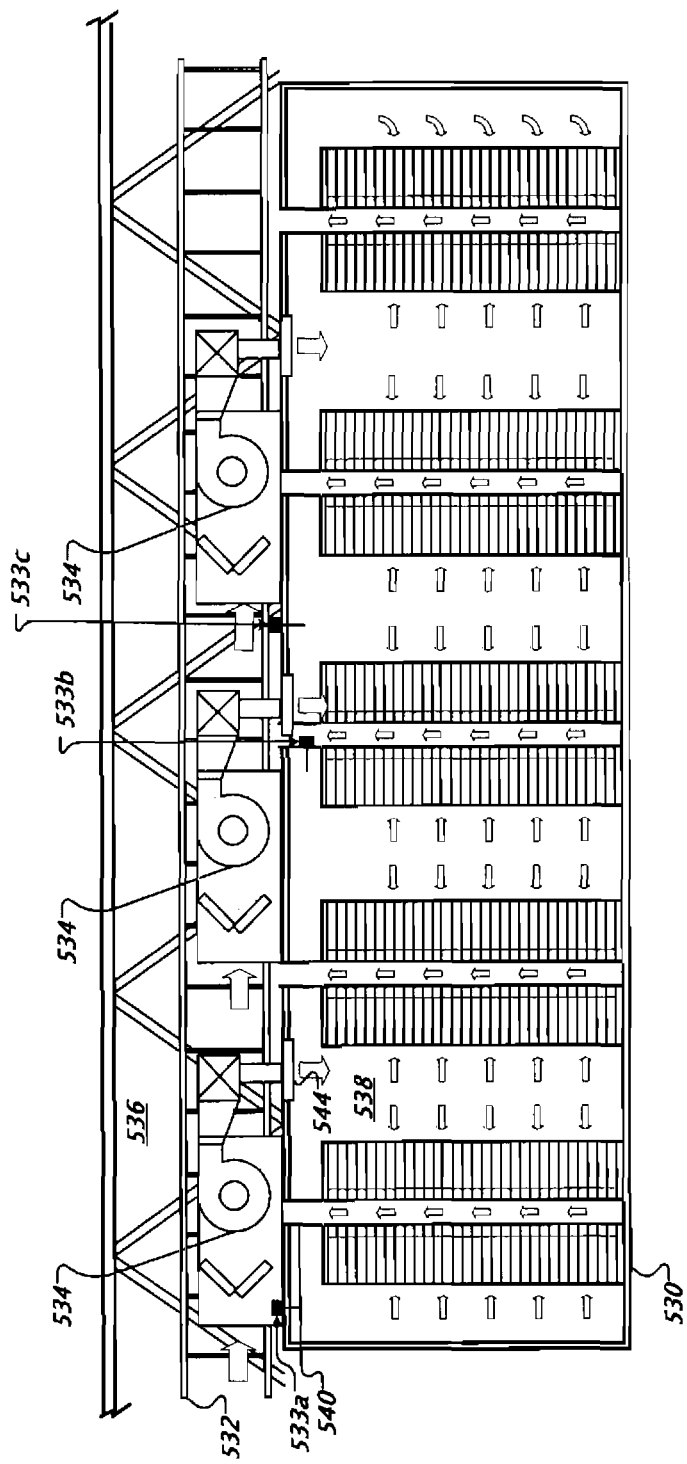
FIG. 5c shows a sectional view of another implementation of a data center.

FIG. 5c shows a sectional view of another implementation of a data center. In this implementation, a number of fan coil units 534 are provided in an attic space 536. The units may also be located, for example in a below floor, or basement, space. As in FIG. 5B, various racks of electronic equipment, such as rack 530, deliver warm air into the attic 536 through various chimneys 540. The chimneys 540 and fan coil units 534 may be positioned so as to avoid interfering with each other and to avoid unwanted pressure changes in the attic 536 or elsewhere. (In addition, basements may be used in a similar manner to attic 536 described here.)

The fan coil units 534 may take any appropriate form, such as commercial fan coil units containing a standard cooling coil and a centrifugal or other form of fan. The fan coil units 534 may each be connected to supply air ductwork that empties into workspace 538. The ductwork may, for example, terminate in diffusers of various forms. The supply ductwork from multiple units 534 may be interconnected to permit for switching or for redundancy if one unit goes down.

One should understand that the units 534 may be laid out in two-dimensions in the attic, so that, for example, the leftmost unit in the figure is not blocking chimney 540. Instead, it may be in front or behind of chimney 540 in the figure. A catwalk 532 may also be provided in attic 536 so as to provide more ready access to units 534. Alternatively, or in addition, provisions may be made to service units 534 from workspace 538.

Pressure sensors 533a-c may also be provided to control the operation of fans coil units 534. In the figures, the pressure sensors 533a-c are shown mounted within a fan coil cabinet, in a plenum or an exhaust tube for a plenum, and in the open attic plenum 536 to sense the pressures in the plenums 536 and are provided with tubed extensions that sense pressure in the workspace 538. The sensors 533a-c may be used to control the system 300 in ways like those discussed above for sensors 209, 211 in FIGS. 2A and 2B.

Figure 6:
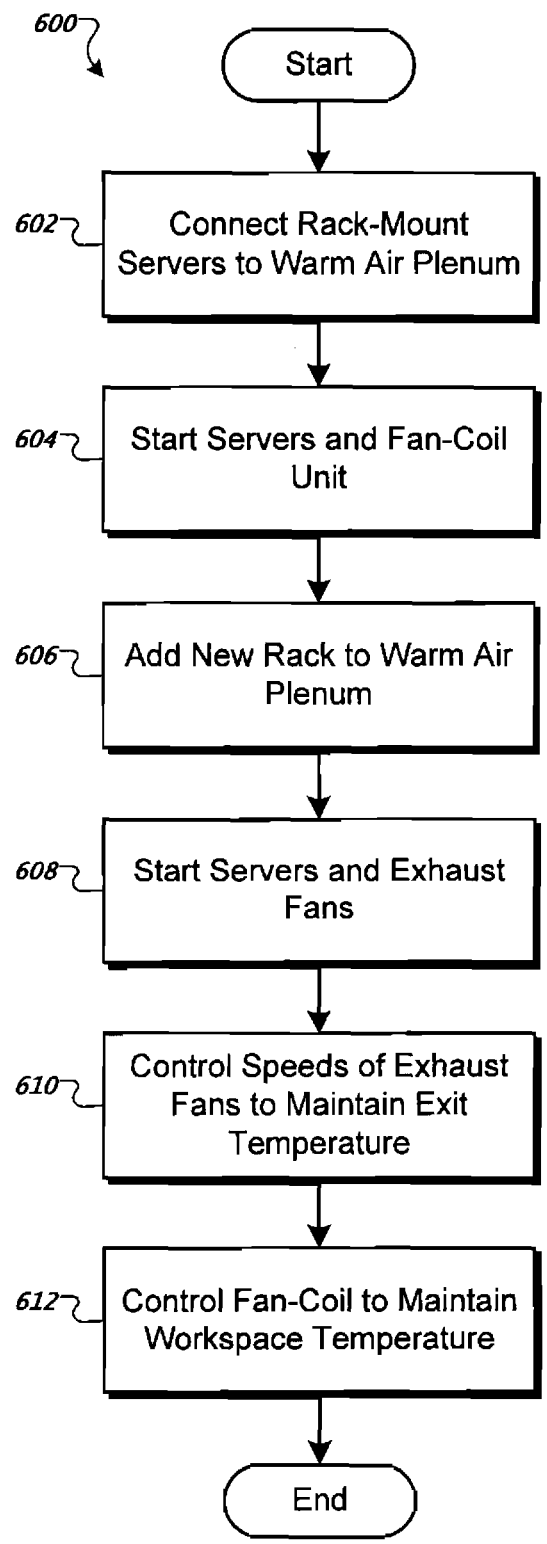
FIG. 6 is a flowchart showing actions for an exemplary operation of cooling components in a data center.

FIG. 6 is a flowchart showing actions for an exemplary operation of cooling components in a data center. In general, the depicted process 600 involves steps for adding computers to a rack-mount computer system, and to control the flow of air over those computers so as to maintain temperatures and temperature changes to permit energy-efficient operation of the system.

At box 602, an operator connects one or more rack-mount servers to a warm air plenum. Such actions may occur by sliding or rolling a pre-loaded rack into the plenum, such as by placing the rack in front of an opening in one wall of the plenum. Alternatively, a rack that is empty or partially full may be moved into location, and additional trays may be added to the rack. Where appropriate, additional steps may be taken to seal around the edges of the racks or the trays in a rack. For example, blanking panels may be provided where trays are missing from a rack so as to prevent short-circuiting of air into the warm air plenum at those locations.

At box 604, the servers are started, as is a fan-coil unit or multiple fan-coil units (which may include packaged units or combinations of fans and cooling coils that are not in a pre-built unit). Starting the servers may entail powering up the various components that support the microprocessors on the servers, including chipsets and hard drives. Each server may be started at the server itself, or may be powered up remotely such as from a central control unit. Operation of the fan-coil unit or units may occur through an HVAC control system that may be configured to sense various parameters related to the controlled environment of the data center and to regulate the operation of components, such as fans and pumps that operate to regulate temperature in a space or spaces. Where multiple fan coil units are employed, they may be located in a mezzanine or attic space, which may itself serve as a warm-air plenum, and may provide cooled air to a workspace.

At box 606, a new rack is added to a warm air plenum. For example, a blanking panel may initially be located over an open space in the plenum, the panel may be removed, and a rack loaded with trays may be slid into place and sealed against the plenum. That rack may then be connected appropriately, such as by providing a power connection from a central source of power, and a networking connection (or multiple connections). Upon making the necessary connections to the trays, such as server trays, and the rack, exhaust fans for pulling air over each tray and into the warm air plenum may also be started at this point, or may be provided power but may delay their start until a particular temperature for a tray is reached. The start-up of each tray may be controlled remotely or locally, as may the control of other components in the system.

At box 610, the speeds of exhaust fans serving the various trays may be controlled to maintain a particular exit temperature at each tray. The speeds may be selected to slow the airflow to a rate lower than would typically be used to cool electronic equipment. The temperature may be selected to produce a particular temperature rise across the computers, where the input temperature is known. For example, as noted above, if the temperature of a workspace is known to be approximately 25 degrees Celsius, then a temperature rise of 20 degrees Celsius may be maintained by holding the exhaust temperature to 45 degrees Celsius.

At box 612, a fan-coil unit may likewise be controlled to maintain a temperature for the workspace. As one example, the fan in a fan-coil arrangement may be modulated using sensors that measure a pressure differential between a warm-air plenum and a workspace, such as to maintain a 0.1 or 0.002 inch pressure difference between the spaces. The pumping rate of cooling water may then be modulated to maintain a set workspace temperature. Also, multiple controls may be aggregated and controlled from a central building management system.

Where pumping cannot meet the load, additional cooling may be provided, such as from a chiller or similar cooling equipment. However, such supplemental cooling will generally not be required, and may only occur on particularly hot or humid days (in which a cooling tower alone cannot sufficiently cool the cooling water), or when load is particularly high. Other free cooling sources (i.e., for cooling with no or almost no chiller operation) or air-side economizer sources other than cooling towers may also be used, such as deep lake and ocean cooling.

FIG. 7 shows plan views of two exemplary trays for use in a rack-mount computer system. Tray 700a hosts a number of storage devices, such as fixed disk drives, while tray 700b includes a computer motherboard holding various computing components. Both trays may be centered around circuit boards, or motherboards, that hold the various components, and on which may be formed conductive traces for electrically connecting the components. Other components may also be provided on the trays, such as supporting chip sets and various forms of connectors, such as SCSI or ATA connectors that may tie tray 700a to tray 700b.

Referring now to each tray 700a, 700b individually, tray 700a contains memory 724 near its front edge, as memory generates relatively less heat than do microprocessors 721a, 721b located downstream. The memory 724 may be located in line with the airflow so as to permit more flow over tray 700a. In addition, network connection 722 may also be mounted at the front edge of tray 700a so as to permit ready connection of the tray 700a to other portions of a rack-mount system. An electrical connector (not shown) may also be provided on the front edge of the tray 700a.

Microprocessors 721a, 721b may be located below impingement fans 720a, 720b, in a manner similar to that discussed above. Supporting chip sets and other components may be located next to or near their respective microprocessor.

Walls 726a, 726c channel airflow over tray 700a, and through power supply 714 and fan 716. As arranged, components that generate more heat are placed closer to the fan, as are components (like the power supply 714) that are less sensitive to high temperatures.

Tray 700b holds a number of hard drives 718a-718c and is dedicated to storage. Because the hard drives 718a-718c generate relatively little heat, tray 700b is not provided with a fan. Although a power supply is not shown, so that tray 700b may share power from another source, tray 700b may also be provided with a power supply on its back edge. The power supply may be provided with a fan or may be allowed to run hot.

Cable connections (not shown) may be provided between the hard drives 718a-718c on tray 700b and the components on tray 700a. For example, standard ATA, SATA, or SCSI cable connections, or other appropriate cable connections, including high-speed custom cable connections may be used to permit high data rate transfers from hard drives 718a-718c. Serial cable connections may provide for better airflow than may ribbon-type parallel cable connections.

Trays 700a, 700b may take on a reduced-size form factor. For example, each of trays 700a, 700b may be approximately 19 inches in length and approximately 6 inches or 5 inches wide. Multiple trays may be part of a single motherboard or may be connected side-by-side to fit in a wider slot in a rack. In such a situation, each tray may be self-contained, with its own power supply and fan (as shown), or the trays may share certain components. Other similar sizes may also be employed so as to fit in existing rack systems.

A number of embodiments have been described. Nevertheless, it will be understood that various modifications may be made without departing from the spirit and scope of the disclosures in this document. For example, additional components may be added to those shown above, or components may be removed or rearranged. Also particular values for temperatures and other such values may be varied. Moreover, steps in processes may be rearranged, added, or removed as appropriate. Accordingly, other embodiments are within the scope of the following claims.

What is claimed is:

1. A method for cooling electronic equipment, comprising:
flowing cooling air from a human-occupiable workspace into a computer rack and across a plurality of computer units supported by the computer rack and into a common warm air plenum located at a first end of the computer units, each computer unit being serviceable through a normally open front end;
controlling, by a first control system, a flow of the cooling air across the plurality of computer units with a plurality of circulation fans that are supported respectively by a plurality of trays that support the plurality of computer units, the plurality of circulation fans controlled to maintain a set temperature rise across the plurality of computer units;
flowing air from the common warm air plenum, through one or more cooling units that are external to the computer rack, and into the human-occupiable workspace adjacent the normally open front end of the computer units that is open to the human-occupiable workspace during operation of the one or more cooling units to receive the flow of cooling air from the human-occupiable workspace; and
controlling, by a second control system, a flow rate of air out of the common warm air plenum with the one or more cooling units to maintain a predetermined pressure differential of approximately zero between the human-occupiable workspace and the common warm air plenum, wherein the second control system controls the flow rate of air out of the warm air plenum independently of the first control system.

2. The method of claim 1, wherein the plurality of computer units are serviceable through the second normally open front ends by a worker located in the workspace during normal operation of the cooling units.

3. The method of claim 1, further comprising measuring a pressure at the normally open front end of the computer units with a pressure sensor in the workspace, and measuring a pressure at the first end of the computer units with a pressure sensor in the warm air plenum.

4. The method of claim 1, wherein controlling the flow rate of air out of the warm air plenum comprises controlling the speed of a plurality of plenum exhaust fans.

5. The method of claim 4, wherein the plurality of plenum exhaust fans are connected to a single control point for a plenum.

6. The method of claim 1, wherein the set temperature rise is more than about 20 degrees Celsius.

7. A system for providing air circulation to rack-mounted computers, the system comprising:
a plurality of rack-mounted computer units, each computer unit having a front end normally open to a human-occupiable workspace that allows the computer unit to be serviced through the front end and a back end opposite the front end;
a plurality of circulation fans mounted respectively to a plurality of trays that support the plurality of rack-mounted computer units to draw air from the human-occupiable workspace and across the plurality of rack-mounted computer units and into a common warm air plenum adjacent respective back ends of the plurality of rack-mounted computer units, the plurality of circulation fans controlled to maintain a set temperature rise across the plurality of rack-mounted computer units;

one or more warm air plenum fans controlled to maintain a set pressure differential of approximately zero between the human-occupiable workspace and the common warm air plenum;

a control system controlling the speed of the one or more warm air plenum fans; and control systems associated with each of the plurality of circulation fans controlled to maintain the set temperature rise across each of the plurality of rack-mounted computers units, wherein the control systems associated with each of the plurality of circulation fans operate independently of the control system controlling the speed of the one or more warm air plenum fans.

8. The system of claim 7, further comprising one or more cooling coils controlled to cool air provided from the warm air plenum to the workspace.

9. The system of claim 7, wherein the control systems associated with each of the plurality of circulation fans do not communicate with the control system controlling the speed of the warm air plenum fans.

10. The system of claim 7, wherein the plurality of rack-mounted computer units are located across an open side wall of the warm air plenum.

11. The system of claim 7, wherein the respective trays comprise a plurality of horizontal motherboards mounted in a vertical stack.

12. The system of claim 7, wherein the plurality of circulation fans are located to draw air across the plurality of rack-mounted computer units and then through power supplies associated with the plurality of rack-mounted computer units.

13. The system of claim 7, wherein the plurality of circulation fans are mounted to the power supplies.

14. The system of claim 7, wherein the plurality of rack-mounted computer units are serviceable through respective front ends that are open to the human-occupiable workspace during normal operation of the plurality of circulation fans mounted to the respective trays that support the plurality of rack-mounted computer units that draw air from the human-occupiable workspace and across the plurality of rack-mounted computer units.

15. The system of claim 7, wherein the one or more warm air plenum fans are mounted in an underfloor air plenum separated from the plurality of rack-mounted computer units by a floor on which the plurality of rack-mounted computer units are supported.

16. The system of claim 7, wherein the one or more warm air plenum fans are mounted in an attic space above the plurality of rack-mounted computer units.

17. The method of claim 1, wherein the second end of the computer units comprises an open-front that is always open to the human-occupiable workspace to receive the flow of cooling air from the human-occupiable workspace and to permit service of at least a portion of the computer units during operation of the one or more cooling units to receive the flow of cooling air from the human-occupiable workspace.

18. The system of claim 7, wherein the respective trays are arranged in a computer rack, the plurality of circulation fans being mounted on the respective of trays near the respective back ends of the plurality of rack-mounted computer units.

* * * * *

UNITED STATES PATENT AND TRADEMARK OFFICE
CERTIFICATE OF CORRECTION

PATENT NO. : 8,636,565 B2  
APPLICATION NO. : 11/757348  
DATED : January 28, 2014  
INVENTOR(S) : Andrew B. Carlson, William Hamburgen and Jimmy Clidaras Page 1 of 1

It is certified that error appears in the above-identified patent and that said Letters Patent is hereby corrected as shown below:

In the Claims

Column 21, Line 10, Claim 7 delete "computers" and insert --computer--.

Signed and Sealed this
Twenty-eighth Day of October, 2014

Michelle K. Lee
*Deputy Director of the United States Patent and Trademark Office*